US012715887B2

(12) United States Patent
Xia

(10) Patent No.: US 12,715,887 B2
(45) Date of Patent: Aug. 25, 2026

(54) ORGANIC LUMINESCENT MATERIALS CONTAINING FLUORINE ANCILLARY LIGANDS

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 749 days.

(21) Appl. No.: 16/101,610

(22) Filed: Aug. 13, 2018

(65) Prior Publication Data

US 2019/0077818 A1 Mar. 14, 2019

Related U.S. Application Data

(60) Provisional application No. 62/555,660, filed on Sep. 8, 2017.

(51) Int. Cl.
*C07F 15/00* (2006.01)
*H10K 50/11* (2023.01)
(Continued)

(52) U.S. Cl.
CPC ...... *C07F 15/0033* (2013.01); *C07F 15/0086* (2013.01); *H10K 50/11* (2023.02);
(Continued)

(58) Field of Classification Search
CPC ......... C09K 11/06; C09K 11/07; C09K 11/08; C09K 11/0805; C09K 11/56;
(Continued)

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 104022232 9/2014
EP 2085450 A1 * 8/2009 ......... H01L 51/0085
(Continued)

OTHER PUBLICATIONS

English translation of WO 2011024977 obtained from Global Dossier (Year: 2011).*
(Continued)

*Primary Examiner* — Braelyn R Watson
(74) *Attorney, Agent, or Firm* — Brown Rudnick LLP; Matthew P. York

(57) ABSTRACT

Organic luminescent materials containing fluorine ancillary ligands are disclosed, which can be used as emitters in the emissive layer of an organic electroluminescent device. The organic luminescent materials is metal complexes which comprise a new series of fluorine containing acetylacetone type ancillary ligands. These novel ligands are effective in tuning the emission color, changing the sublimation properties, improving quantum efficiency and improving device performance. Also disclosed is an electroluminescent device and a formulation.

12 Claims, 3 Drawing Sheets

Figure 1:
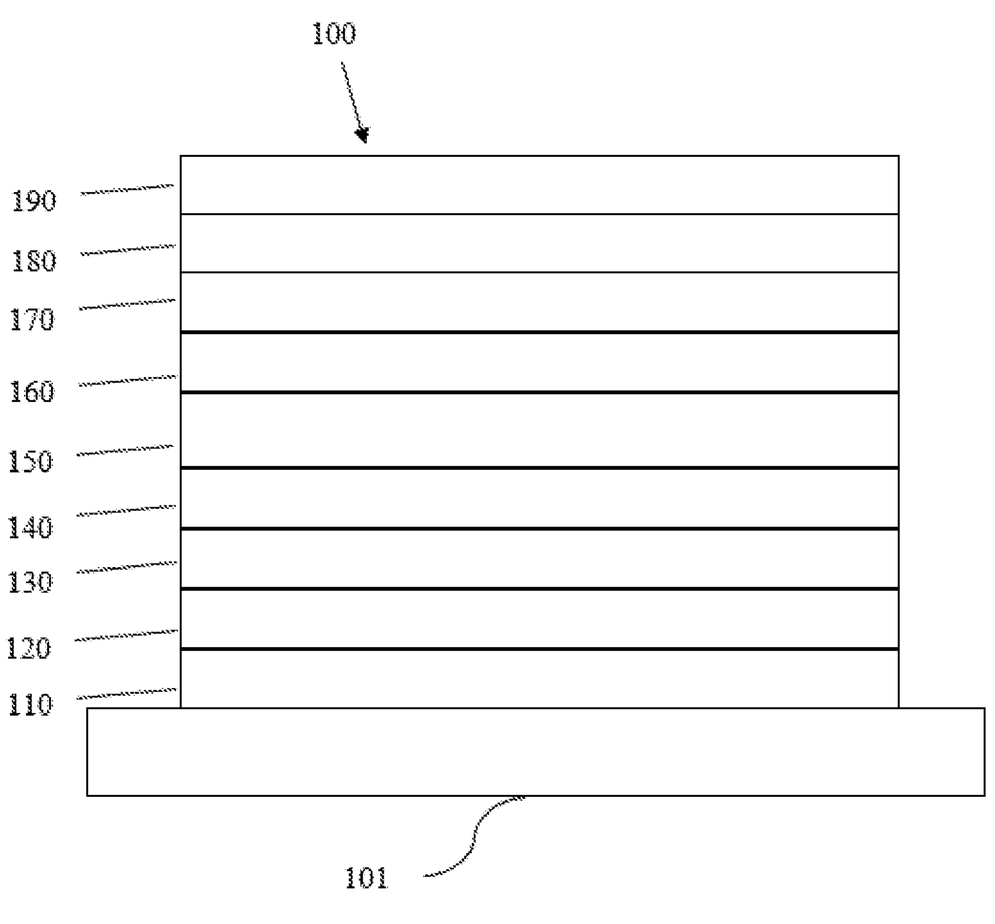

(51) Int. Cl.
*H10K 50/125* (2023.01)
*H10K 85/30* (2023.01)
*H10K 101/10* (2023.01)
*H10K 85/60* (2023.01)
*H10K 102/10* (2023.01)

(52) U.S. Cl.
CPC ......... *H10K 50/125* (2023.02); *H10K 85/342* (2023.02); *H10K 85/346* (2023.02); *H10K 85/631* (2023.02); *H10K 2101/10* (2023.02); *H10K 2102/103* (2023.02)

(58) Field of Classification Search
CPC .............. C09K 11/562; C09K 2211/18; C09K 2211/185; C09K 2211/182–188; H01L 51/0051; H01L 51/0052; H01L 51/0062; H01L 51/0067; H01L 51/0068; H01L 51/0071; H01L 51/0072; H01L 51/0074; H01L 51/50; H01L 51/5012; H01L 51/5016; H01L 51/502; H01L 51/5024; H01L 51/5028; H01L 51/5036; H01L 51/504; H01L 51/5048; H01L 51/5088; H01L 51/5092; H01L 51/5096; H01L 51/0059; H01L 51/008; H01L 51/0077–0089; H01L 51/0091–0092; C07F 15/0033; C07F 15/0086; C07F 15/0046; C07F 15/006; C07F 15/0073; C07F 5/00; C07F 5/003; C07F 5/06–069; C07F 7/00; C07F 7/003; C07F 7/22–28; C07F 9/00; C07F 9/005; C07F 1/12; H10K 50/125; H10K 50/11; H10K 85/631; H10K 2101/10; H10K 2102/103; H10K 85/371; H10K 85/30–351; H10K 85/381

See application file for complete search history.

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 9,837,623 | B2 | 12/2017 | Kim et al. | |
| 9,882,149 | B2 | 1/2018 | Kim et al. | |
| 10,135,007 | B2 | 11/2018 | Ma et al. | |
| 10,164,198 | B2 | 12/2018 | Bae et al. | |
| 2003/0189216 | A1* | 10/2003 | Kamatani | H10K 50/11 257/98 |
| 2003/0230980 | A1 | 12/2003 | Forrest et al. | |
| 2004/0174116 | A1 | 9/2004 | Lu et al. | |
| 2007/0259205 | A1 | 11/2007 | Ionkin et al. | |
| 2008/0001515 | A1 | 1/2008 | Iwanaga et al. | |
| 2010/0187977 | A1* | 7/2010 | Kai | C07D 487/04 546/276.7 |
| 2010/0288362 | A1* | 11/2010 | Hatwar | H01L 51/5278 136/263 |
| 2011/0175066 | A1 | 7/2011 | Sakuma et al. | |
| 2012/0153273 | A1* | 6/2012 | Takada | H01L 51/0085 257/E51.026 |
| 2013/0277662 | A1 | 10/2013 | Aratani et al. | |
| 2015/0001472 | A1* | 1/2015 | Boudreault | H01L 51/0085 546/4 |
| 2015/0349273 | A1 | 12/2015 | Hung et al. | |
| 2016/0104848 | A1* | 4/2016 | Boudreault | C07F 15/0033 546/4 |
| 2016/0285013 | A1 | 9/2016 | Boudreault et al. | |
| 2016/0359122 | A1 | 12/2016 | Boudreault et al. | |
| 2017/0352821 | A1 | 12/2017 | Boudreault et al. | |
| 2018/0190914 | A1 | 7/2018 | Tsai et al. | |

FOREIGN PATENT DOCUMENTS

| | | | | | |
|---|---|---|---|---|---|
| JP | H10158639 | | | 6/1998 | |
| JP | 2013021138 | | | 1/2013 | |
| JP | 2014175479 | A | * | 9/2014 | |
| WO | 2011024977 | | | 3/2011 | |
| WO | WO2011024977 | A | * | 3/2011 | |
| WO | WO-2011024977 | A1 | * | 3/2011 | H01L 51/0085 |
| WO | 2013011883 | | | 1/2013 | |

OTHER PUBLICATIONS

Abe, Taichi, et al. "Deuteration isotope effect on nonradiative transition of fac-tris (2-phenylpyridinato) iridium (III) complexes." Chemical Physics Letters 491.4-6 (2010): 199-202. (Year: 2010).*

Knunyants, I. L., and S. M. Igumnov. "β-Diketones containing perfluoroisopropyl and perfluoro-tert-butyl groups." Bulletin of the Academy of Sciences of the USSR, Division of chemical science 31.1 (1982): 192-194. (Year: 1982).*

CIE 1931 color space, Wikipedia, 2022 (Year: 2022).*

Platinum, Berkeley, 2023. https://nature.berkeley.edu/classes/eps2/wisc/pt.html#:~:text=The%20predominant%20oxidation%20states%20of,dissolves%20readily%20in%20aqua%20regia. (Year: 2023).*

English translation of WO 2011024977 obtained by Google Patents (Year: 2011).*

English translation of JP2014175479 A obtained by Google Patents (Year: 2014).*

Tang, C. W. et al., "Organic electroluminescent diodes", Applied Physics Letters, 51(12): 913-915 (1987).

"Fluorinated β-Diketones for the Extraction of Lanthanide lons: Photophysical Properties and Hydration Numbers of Their EuIll Complexes", Anne-Sophie Chauvin et al., Eur. J. Inorg. Chem., 2006,473-480.DOI:10.1002/ejic.200500849.

"Structure, magnetic properties and thermal sublimation of fluorinated Fe4 single-molecule magnets", Luca Rigamonti et al.,Polyhedron, 2017,19-17.DOI:10.1016/j.poly.2017.02.036.

Chinese Search Report issued in Chinese Application No. 201811041203X date of mailing: Oct. 10, 2020, 3 pages.

English translation of Chinese Search Report issued in Chinese Application No. 201811041203X, date of mailing: Oct. 10, 2020, 1 page.

* cited by examiner

ORGANIC LUMINESCENT MATERIALS CONTAINING FLUORINE ANCILLARY LIGANDS

This application claims the benefit of U.S. Provisional Application No. 62/555,660, filed Sep. 8, 2017, the entire content of which is incorporated herein by reference.

1 FIELD OF THE INVENTION

The present invention relates to a compound for organic electronic devices, such as organic light emitting devices. More specifically, the present invention relates to a metal complex containing fluorine ancillary ligands and a formulation comprising the metal complex.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process, such as spin-coating, ink-jet printing, and nozzle printing. Small molecule OLEDs can also be fabricated by solution process if the materials can be dissolved or dispersed in solvents.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime. For fluorescent blue OLEDs, the color saturation, device efficiency, and device lifetime need to be improved to reduce power consumption. In the meantime, TADF devices haven't reached the lifetime goal for commercialization. TADF emitters also need to improve their color purity, severe efficiency roll-off, and device lifetime.

Ancillary ligands in phosphorescent material can be used to fine tune the emission wavelength, improve the sublimation properties, and improve the efficiency of the material. Existing ancillary ligands such as acetylacetone type ligands, particularly acetylacetone type ligands containing branched-chain alkyl groups, have achieved some effect in controlling properties as described above, but their properties need to be further improved to meet the increasing performance requirements, in particular to provide a more efficient means of controlling the wavelength of emission and to improve the quantum efficiency of materials. The present invention provides a new fluorine containing ancillary ligand which is capable of more effectively controlling the emission wavelength and improving the quantum efficiency as compared to the ancillary ligands already reported.

3 SUMMARY OF THE INVENTION

The present invention aims to provide a new series of fluorine containing acetylacetone type ancillary ligands to solve the above problems. The ligands can be used in emitters in the emissive layer of an organic electroluminescent device. By incorporating these ligands to metal complexes, the emission color can be more effectively tuned, and the sublimation properties and quantum efficiency are also improved.

According to an embodiment of the present invention, a metal complex is disclosed, which comprising a ligand $L_a$ represented by Formula 1:

Formula 1

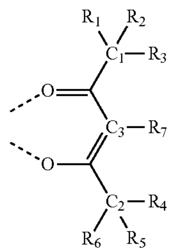

Wherein $C_1$, $C_2$, and $C_3$ are carbon atoms;

$R_1$, $R_2$, $R_3$, $R_4$, $R_5$, $R_6$, and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

at least one of $R_1$, $R_2$, $R_3$, $R_4$, $R_5$, $R_6$, and $R_7$ contains at least one fluorine atom, and said fluorine atom is not directly connected to $C_1$, $C_2$, or $C_3$;

two adjacent substituents are optionally joined to form a ring.

According to another embodiment, an electroluminescent device is disclosed, which comprising:

an anode, a cathode, and an organic layer, disposed between the anode and the cathode, comprising a metal complex comprising a ligand $L_a$ with formula 1:

Formula 1

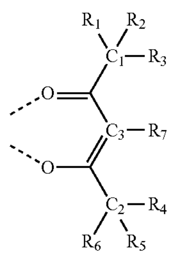

Wherein $C_1$, $C_2$, and $C_3$ are carbon atoms;

$R_1$, $R_2$, $R_3$, $R_4$, $R_5$, $R_6$, and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

at least one of $R_1$, $R_2$, $R_3$, $R_4$, $R_5$, $R_6$, and $R_7$ contains at least one fluorine atom, and said fluorine atom is not directly connected to $C_1$, $C_2$, or $C_3$;

two adjacent substituents are optionally joined to form a ring.

According to yet another embodiment, a formulation comprising a metal complex is also disclosed. Said metal complex comprises a ligand $L_a$ represented by Formula 1.

The metal complex comprising new fluorine containing ancillary ligands disclosed in the present invention can be used as emitters in the emissive layer of the organic electroluminescent device. These new ligands can effectively tune the emission color, change the sublimation characteristics and improve the quantum efficiency. The ligands and compounds can be easily used in the manufacture of OLEDs, which can provide efficient OLEDs and long lifetime.

4 BRIEF DESCRIPTION OF THE DRAWINGS

FIG. 1 schematically shows an organic light emitting device that can incorporate the ligands, metal complex and formulation disclosed herein.

Figure 2:
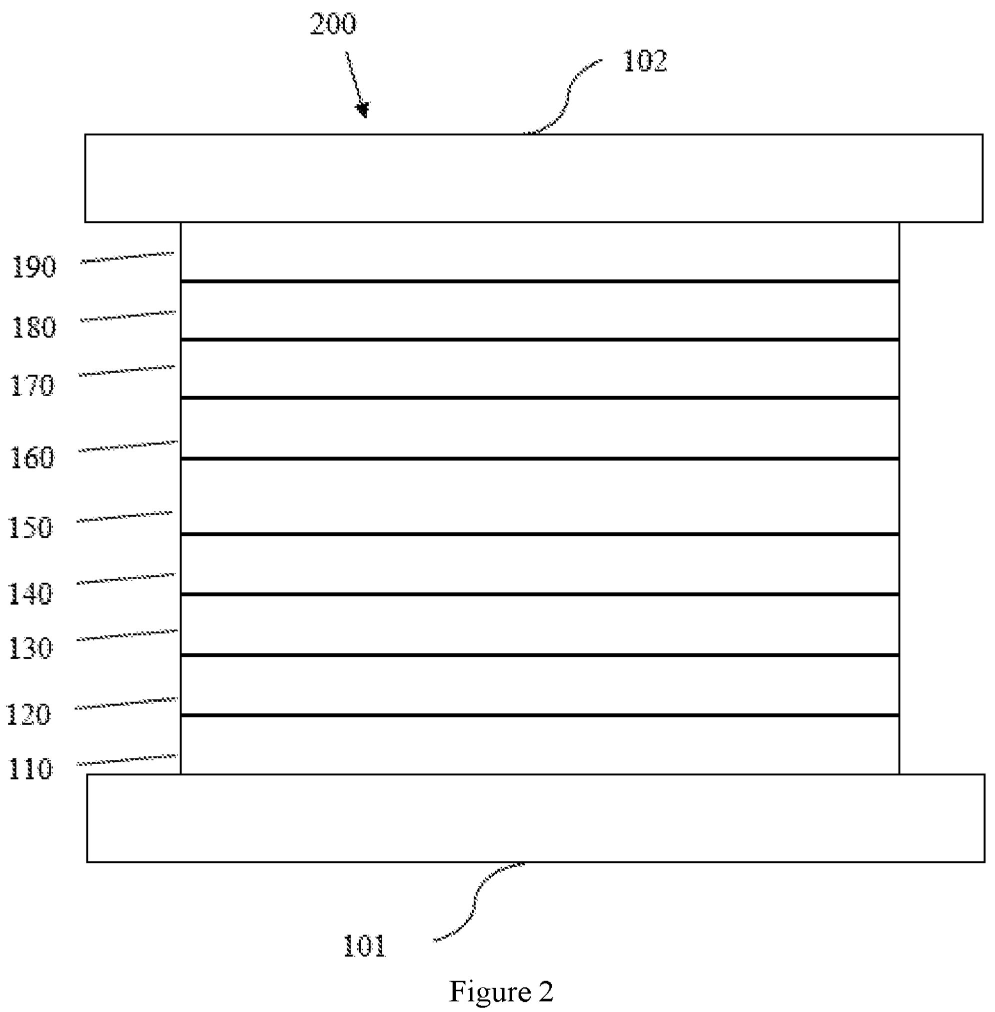

FIG. 2 schematically shows another organic light emitting device that can incorporate the ligands, metal complex and formulation disclosed herein.

Figure 3:
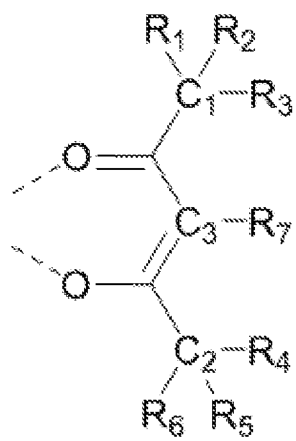

FIG. 3 shows the ligand compound La of Formula 1 disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

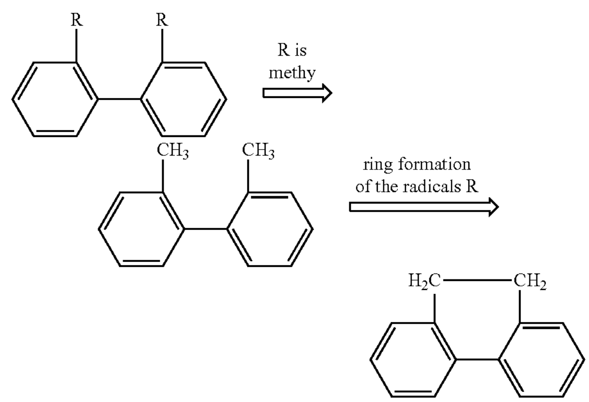

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

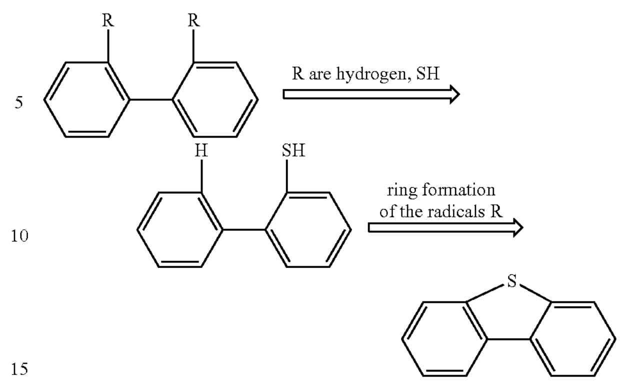

According to an embodiment of the present invention, a metal complex comprising a ligand $L_a$ represented by Formula 1 is disclosed:

Formula 1

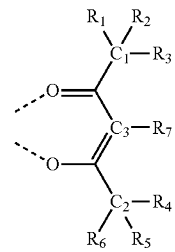

Wherein $C_1$, $C_2$, and $C_3$ are carbon atoms;

$R_1$, $R_2$, $R_3$, $R_4$, $R_5$, $R_6$, and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

at least one of $R_1$, $R_2$, $R_3$, $R_4$, $R_5$, $R_6$, and $R_7$ contains at least one fluorine atom, and the fluorine atom is not directly connected to $C_1$, $C_2$, or $C_3$;

two adjacent substituents are optionally joined to form a ring.

In one embodiment, wherein the metal is selected from the group consisting of Cu, Ag, Au, Ru, Rh, Pd, Pt, Os, and Ir.

In one embodiment, wherein the metal is selected from the group consisting of Pt and Ir.

In one embodiment, wherein $R_7$ is selected from the group consisting of hydrogen, deuterium, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, and combinations thereof.

In one embodiment, wherein $R_7$ is hydrogen or deuterium.

In one embodiment, wherein $R_1$, $R_2$, $R_3$, $R_4$, $R_5$, and $R_6$ are each independently selected from group consisting of hydrogen, deuterium, fluorine, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, and combinations thereof.

In one embodiment, wherein the metal complex has the formula of $M(L_a)_m(L_b)_n(L_c)_q$, wherein $L_b$ and $L_c$ are the second and third ligand coordinating to M, $L_b$ and $L_c$ can be the same of different;

$L_a$, $L_b$, and $L_c$ can be optionally joined to form a multidentate ligand;

Wherein m is 1, 2, or 3, n is 0, 1, or 2, q is 0, 1, or 2; m+n+q is the oxidation state of M;

Wherein $L_b$ and $L_c$ are independently selected from the group consisting of:

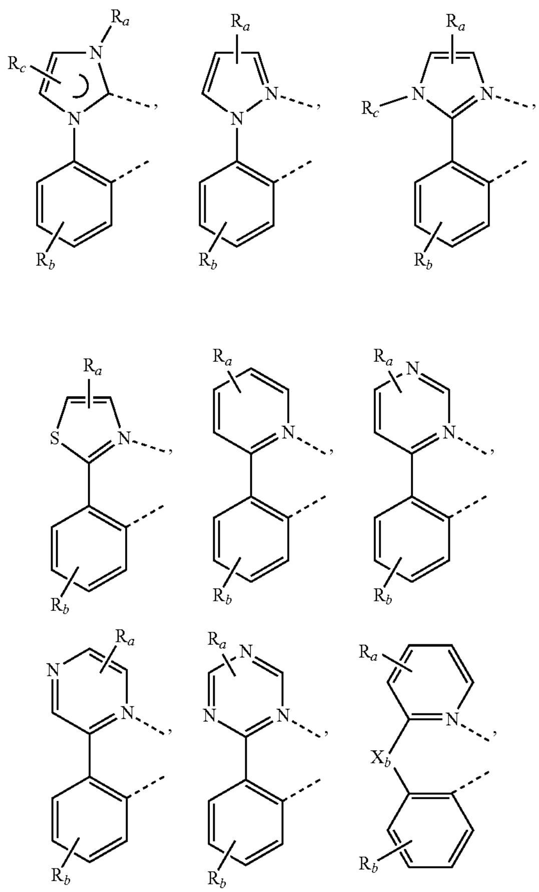

-continued

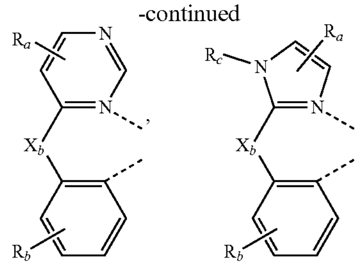

Wherein $R_a$, $R_b$, and $R_c$ can represent mono, di, tri, or tetra substitution or no substitution;

$R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

$X_b$ is selected from the group consisting of O, S, Se, $NR_{N1}$, and $CR_{C1}R_{C2}$;

$R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring.

In one embodiment, wherein the metal complex has the formula of $Ir(L_a)(L_b)_2$.

In one preferred embodiment, wherein the ligand $L_a$ of Formula 1 is selected from the group consisting of:
$L_{a1}$
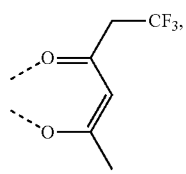
$L_{a2}$
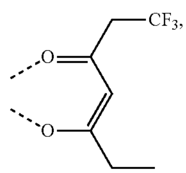
$L_{a3}$
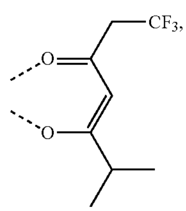
$L_{a4}$
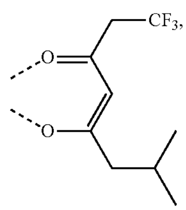
$L_{a5}$
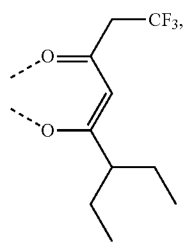
$L_{a6}$
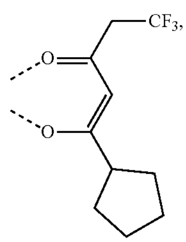
$L_{a7}$
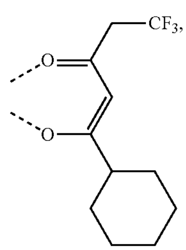
-continued
$L_{a8}$
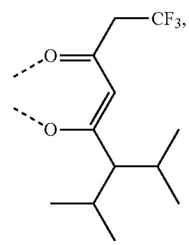
$L_{a9}$
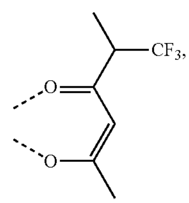
$L_{a10}$
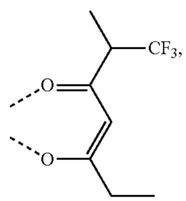
$L_{a11}$
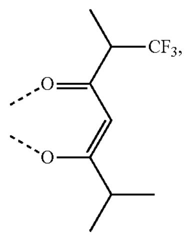
$L_{a12}$
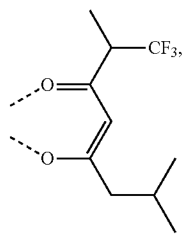
$L_{a13}$
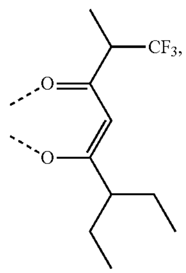

-continued
$L_{a14}$
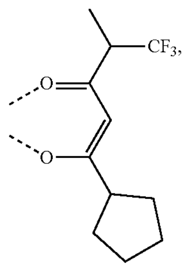
$L_{a15}$
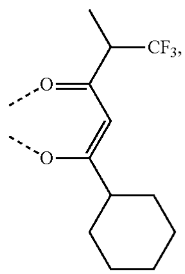
$L_{a16}$
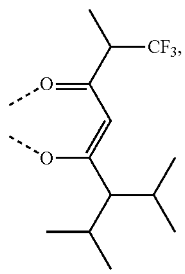
$L_{a17}$
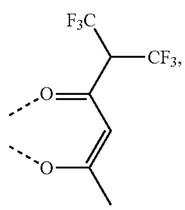
$L_{a18}$
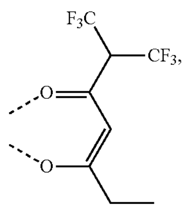
$L_{a19}$
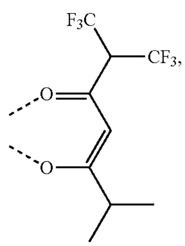
-continued
$L_{a20}$
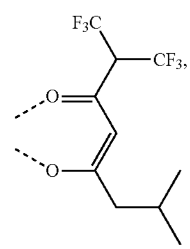
$L_{a21}$
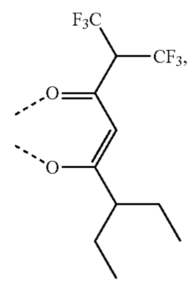
$L_{a22}$
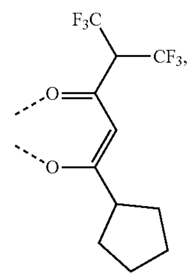
$L_{a23}$
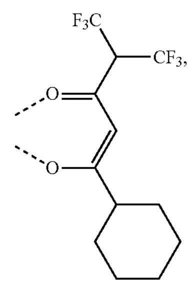
$L_{a24}$
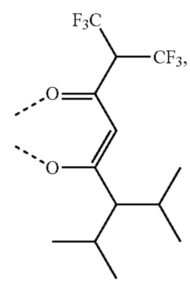
$L_{a25}$
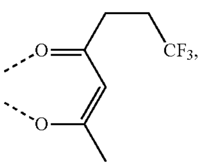

-continued
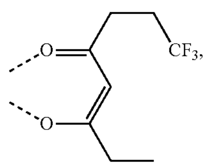
$L_{a26}$
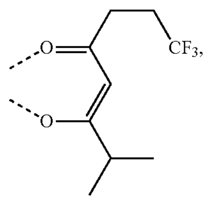
$L_{a27}$
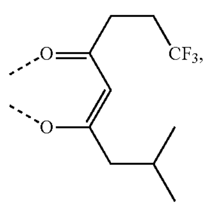
$L_{a28}$
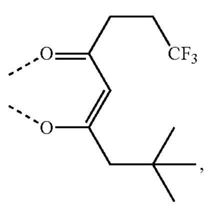
$L_{a29}$
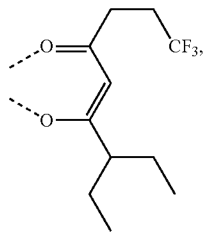
$L_{a30}$
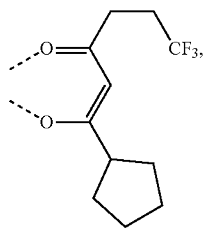
$L_{a31}$
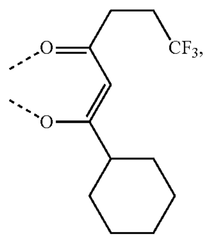
$L_{a32}$
-continued
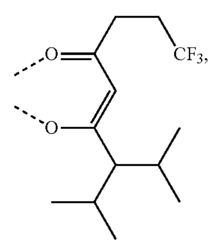
$L_{a33}$
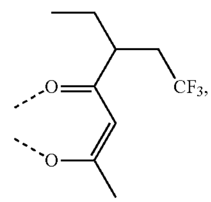
$L_{a34}$
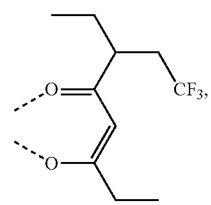
$L_{a35}$
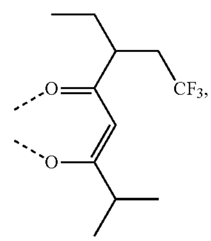
$L_{a36}$
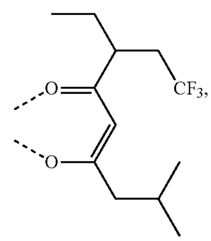
$L_{a37}$
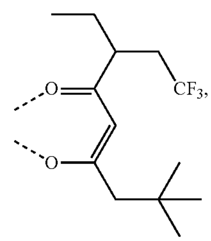
$L_{a38}$ -continued
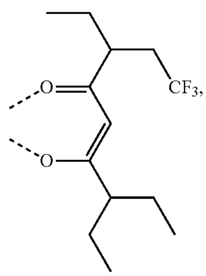
$L_{a39}$
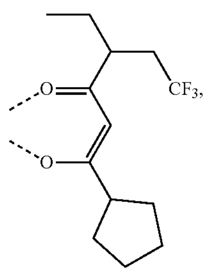
$L_{a40}$
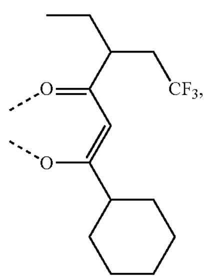
$L_{a41}$
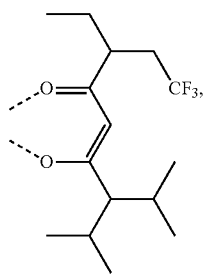
$L_{a42}$
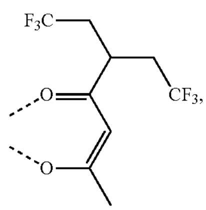
$L_{a43}$
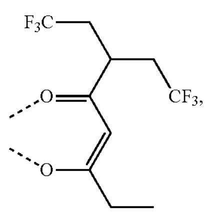
$L_{a44}$
-continued
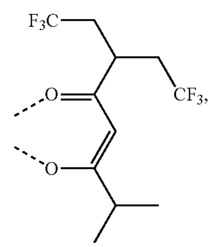
$L_{a45}$
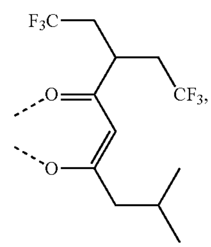
$L_{a46}$
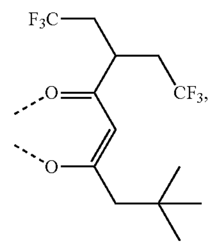
$L_{a47}$
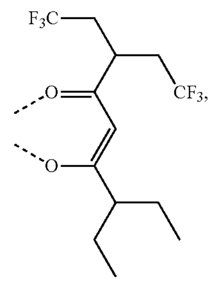
$L_{a48}$
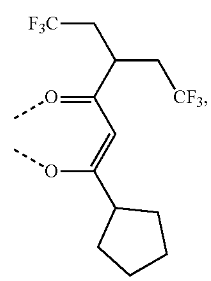
$L_{a49}$
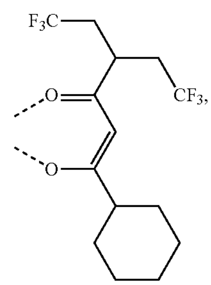
$L_{a50}$ -continued
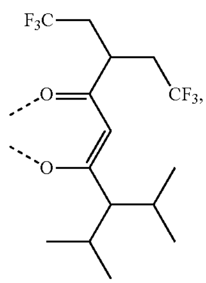
$L_{a51}$
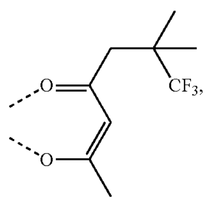
$L_{a52}$
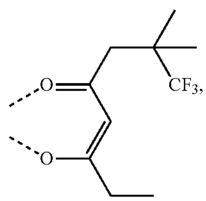
$L_{a53}$
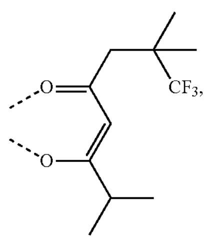
$L_{a54}$
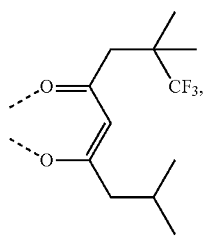
$L_{a55}$
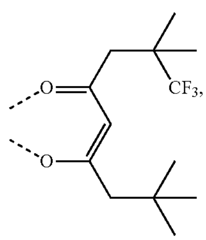
$L_{a56}$
-continued
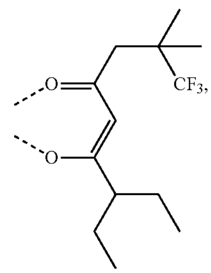
$L_{a57}$
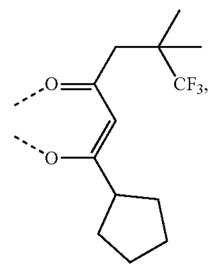
$L_{a58}$
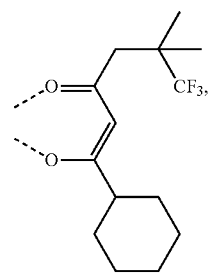
$L_{a59}$
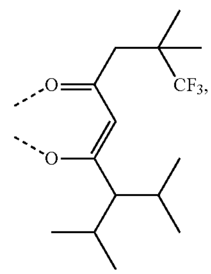
$L_{a60}$
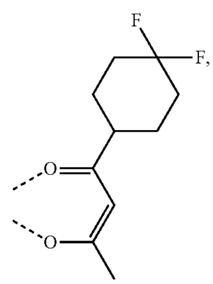
$L_{a61}$ -continued
$L_{a62}$
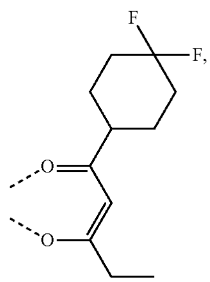
$L_{a63}$
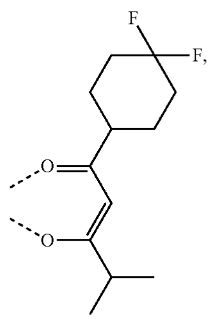
$L_{a64}$
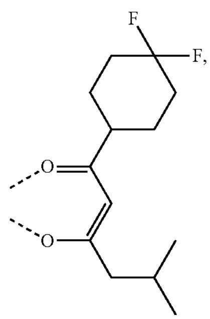
$L_{a65}$
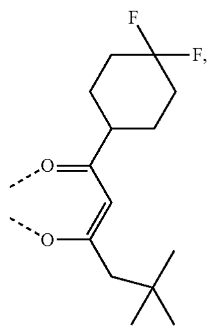
$L_{a66}$
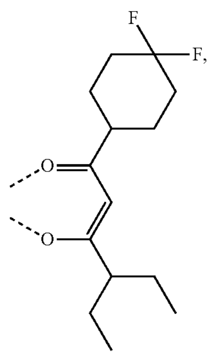
-continued
$L_{a67}$
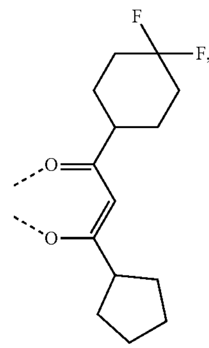
$L_{a68}$
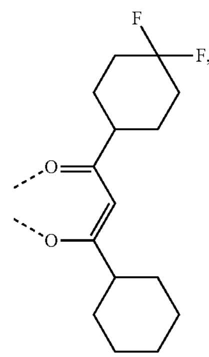
$L_{a69}$
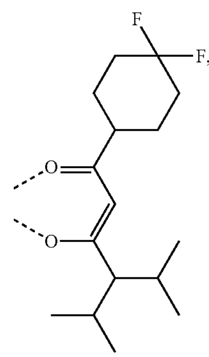
$L_{a70}$
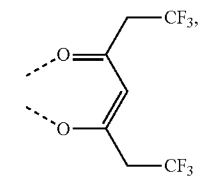
$L_{a71}$
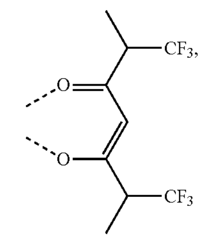

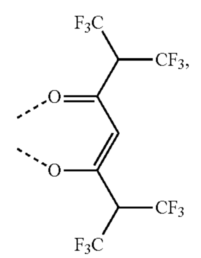
$L_{a72}$
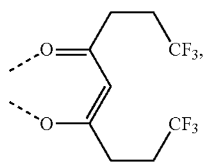
$L_{a73}$
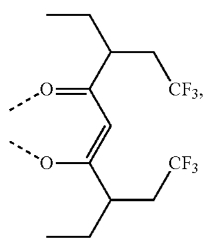
$L_{a74}$
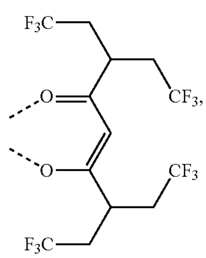
$L_{a75}$
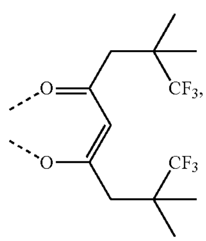
$L_{a76}$
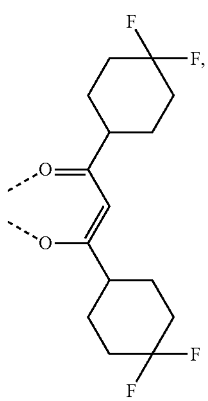
$L_{a77}$
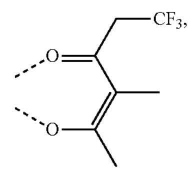
$L_{a78}$
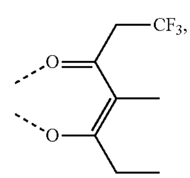
$L_{a79}$
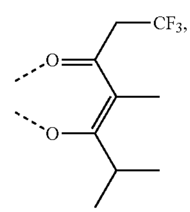
$L_{a80}$
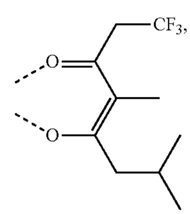
$L_{a81}$
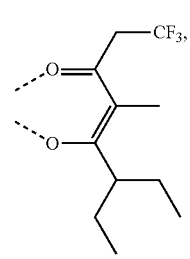
$L_{a82}$
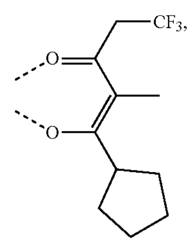
$L_{a83}$
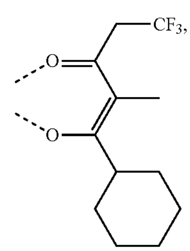
$L_{a84}$ -continued
$L_{a85}$
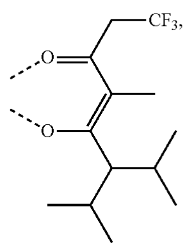
$L_{a86}$
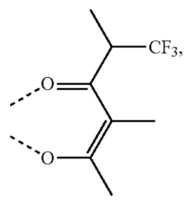
$L_{a87}$
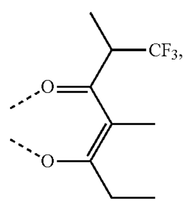
$L_{a88}$
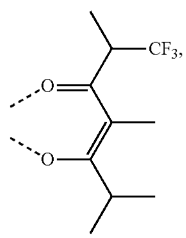
$L_{a89}$
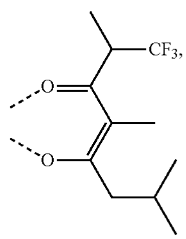
$L_{a90}$
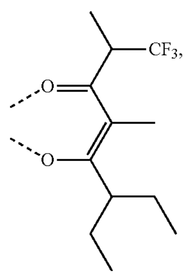
-continued
$L_{a91}$
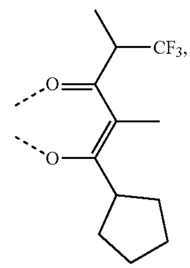
$L_{a92}$
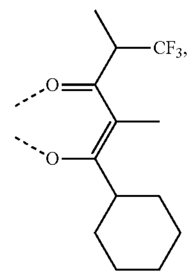
$L_{a93}$
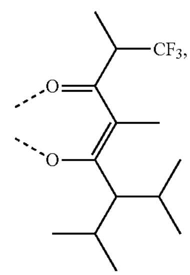
$L_{a94}$
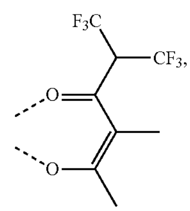
$L_{a95}$
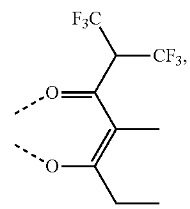
$L_{a96}$
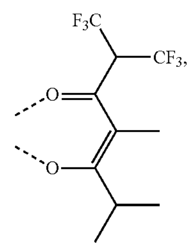

-continued
$L_{a97}$
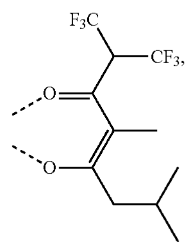
$L_{a98}$
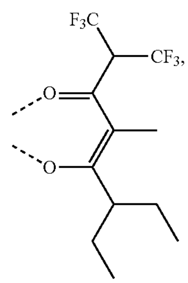
$L_{a99}$
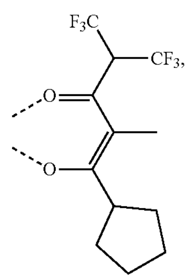
$L_{a100}$
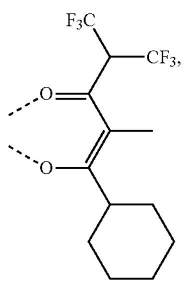
$L_{a101}$
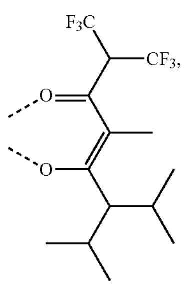
$L_{a102}$
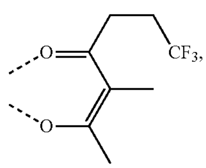
-continued
$L_{a103}$
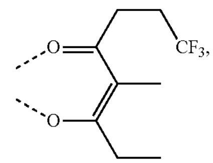
$L_{a104}$
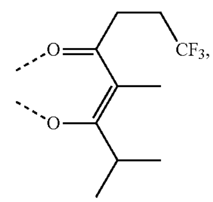
$L_{a105}$
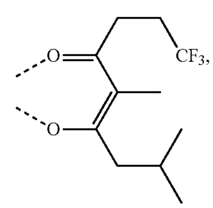
$L_{a106}$
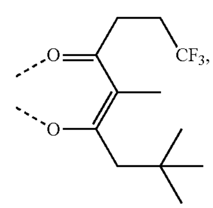
$L_{a107}$
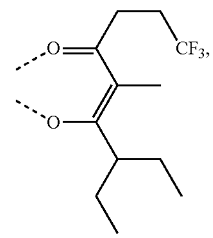
$L_{a108}$
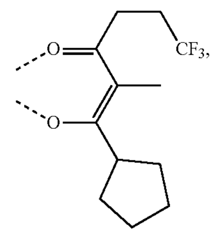
$L_{a109}$
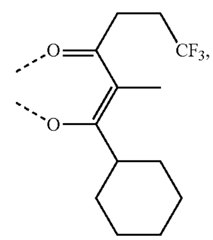

-continued
$L_{a110}$
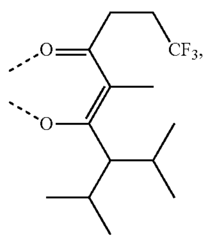
$L_{a111}$
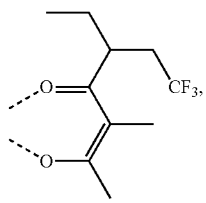
$L_{a112}$
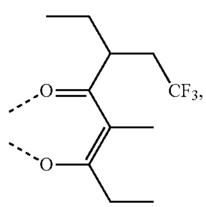
$L_{a113}$
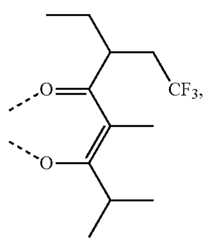
$L_{a114}$
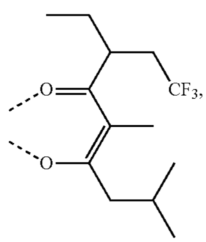
$L_{a115}$
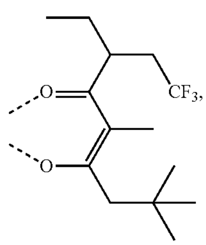
-continued
$L_{a116}$
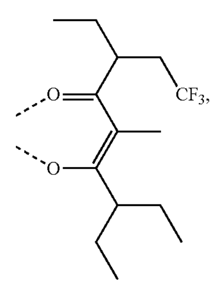
$L_{a117}$
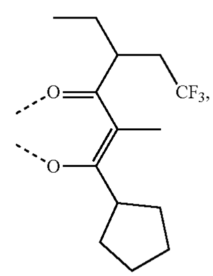
$L_{a118}$
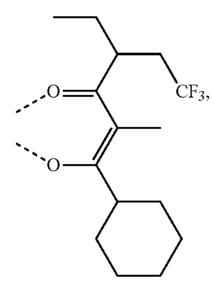
$L_{a119}$
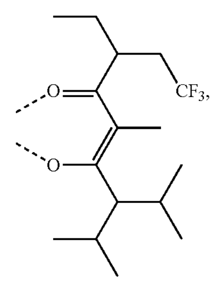
$L_{a120}$
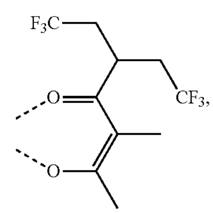
$L_{a121}$
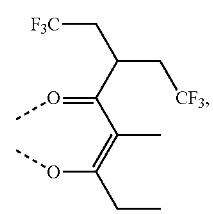

-continued
$L_{a122}$
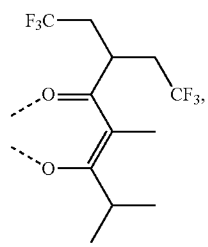
$L_{a123}$
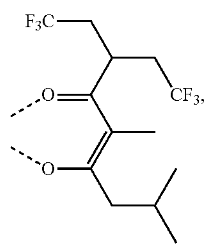
$L_{a124}$
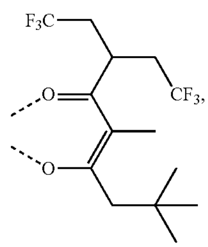
$L_{a125}$
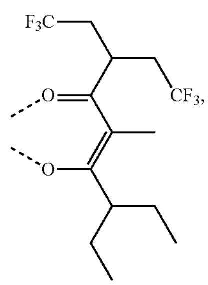
$L_{a126}$
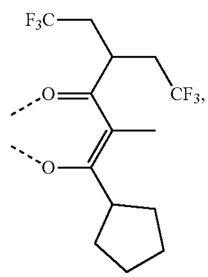
$L_{a127}$
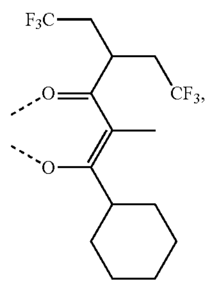
-continued
$L_{a128}$
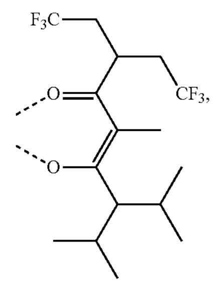
$L_{a129}$
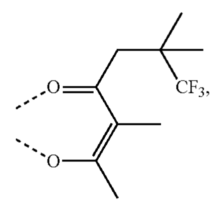
$L_{a130}$
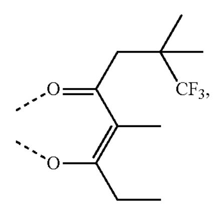
$L_{a131}$
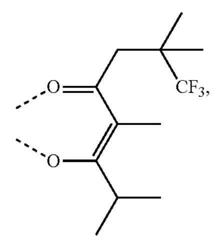
$L_{a132}$
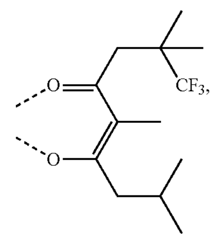
$L_{a133}$
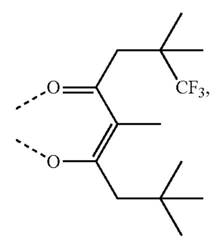

-continued
$L_{a134}$
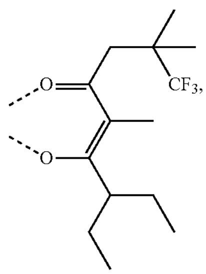
$L_{a135}$
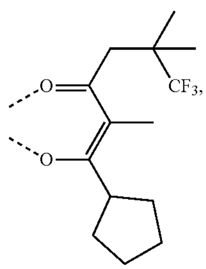
$L_{a136}$
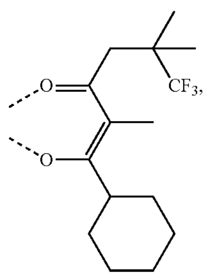
$L_{a137}$
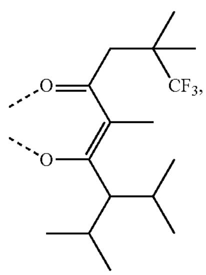
$L_{a138}$
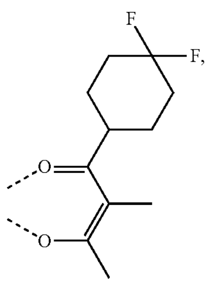
-continued
$L_{a139}$
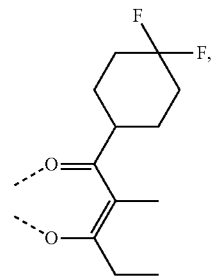
$L_{a140}$
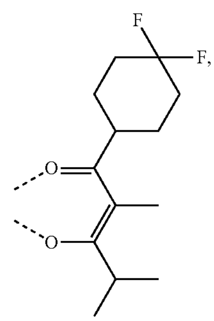
$L_{a141}$
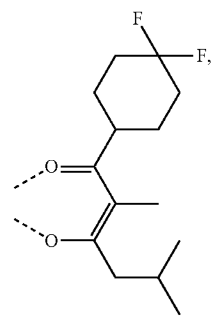
$L_{a142}$
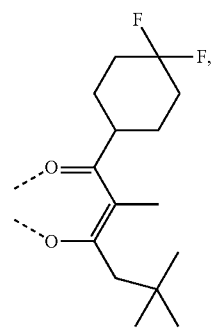
$L_{a143}$
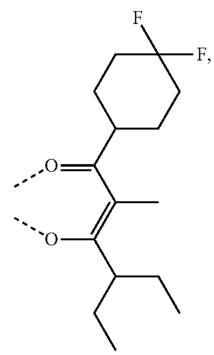

-continued
$L_{a144}$
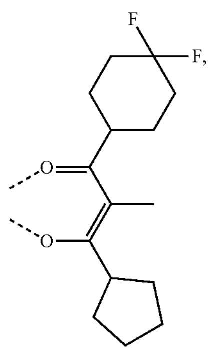
$L_{a145}$
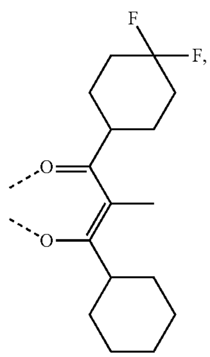
$L_{a146}$
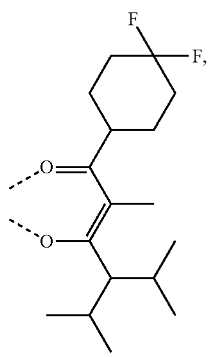
$L_{a147}$
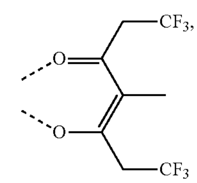
$L_{a148}$
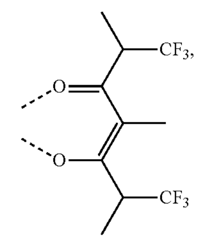
-continued
$L_{a149}$
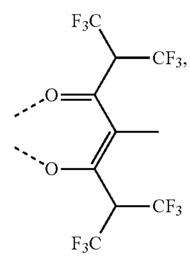
$L_{a150}$
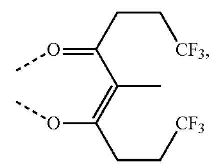
$L_{a151}$
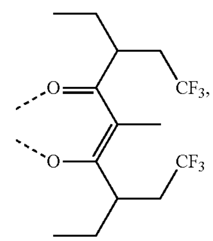
$L_{a152}$
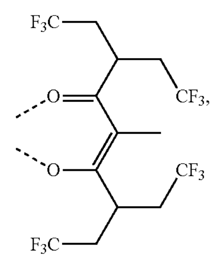
$L_{a153}$
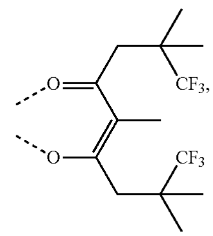
$L_{a154}$
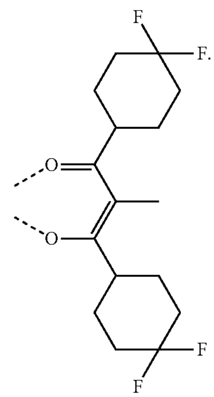
In one preferred embodiment, wherein the ligand $L_b$ is selected from the group consisting of:

-continued
$L_{b1}$
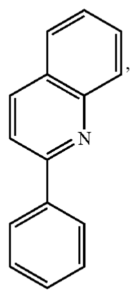
$L_{b2}$
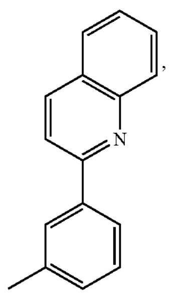
$L_{b3}$
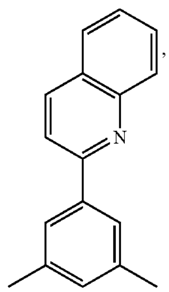
$L_{b4}$
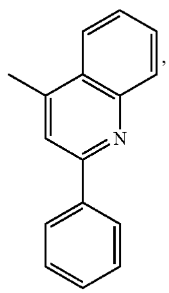
$L_{b5}$
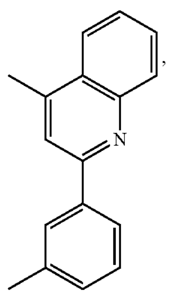
$L_{b6}$
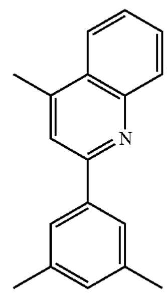
$L_{b7}$
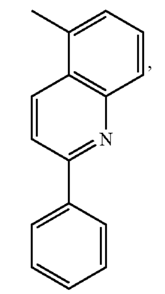
$L_{b8}$
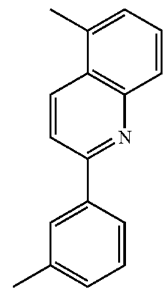
$L_{b9}$
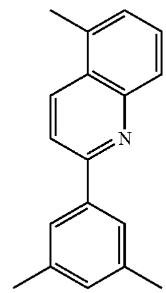
$L_{b10}$
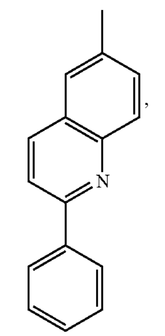

$L_{b11}$
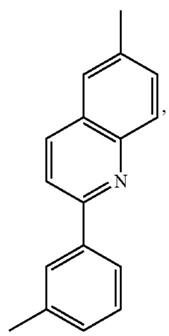
$L_{b12}$
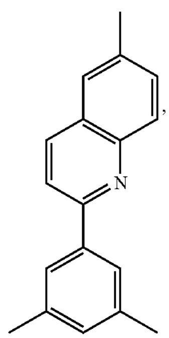
$L_{b13}$
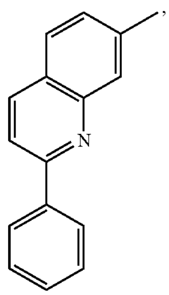
$L_{b14}$
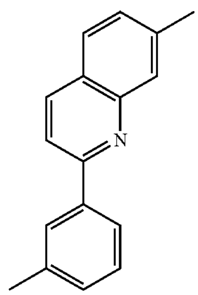
$L_{b15}$
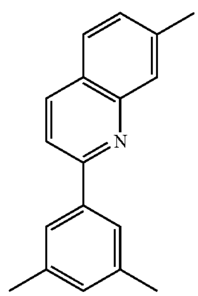
$L_{b16}$
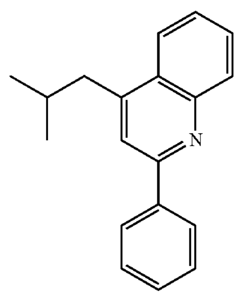
$L_{b17}$
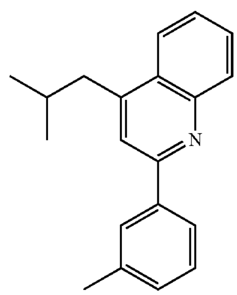
$L_{b18}$
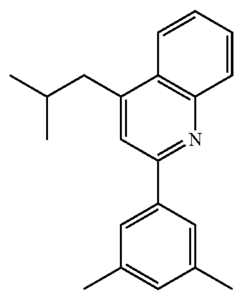
$L_{b19}$
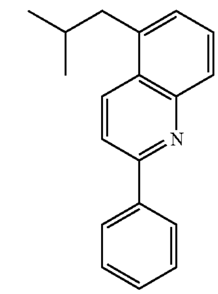
$L_{b20}$
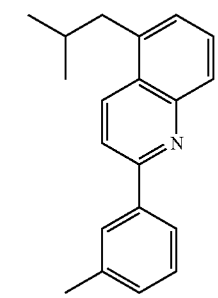

-continued
$L_{b21}$
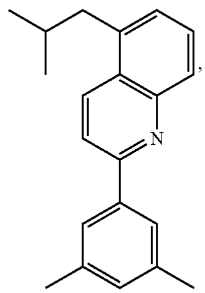
$L_{b22}$
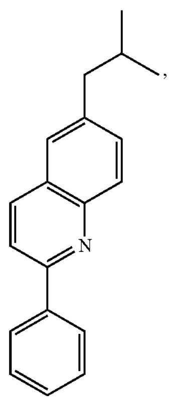
$L_{b23}$
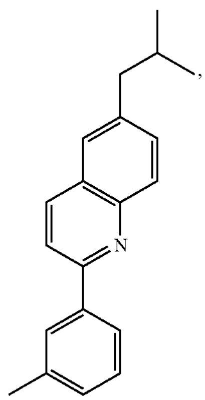
$L_{b24}$
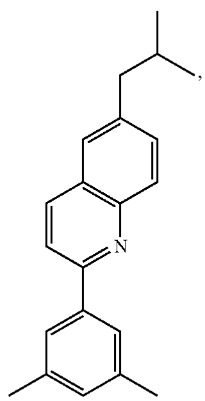
-continued
$L_{b25}$
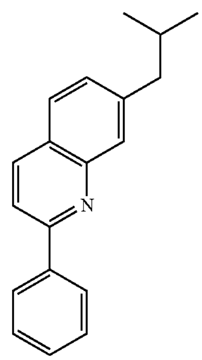
$L_{b26}$
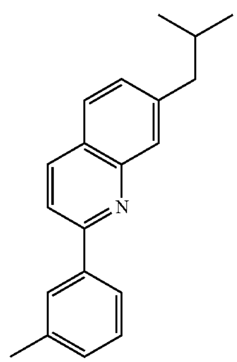
$L_{b27}$
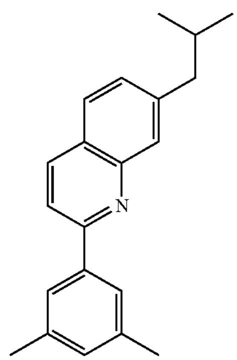
$L_{b28}$
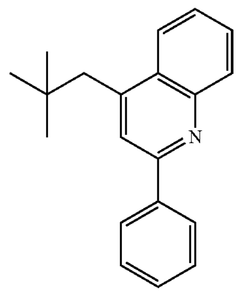

-continued
$L_{b29}$
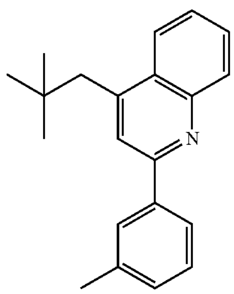
$L_{b30}$
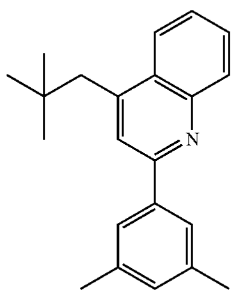
$L_{b31}$
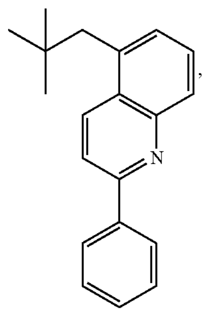
$L_{b32}$
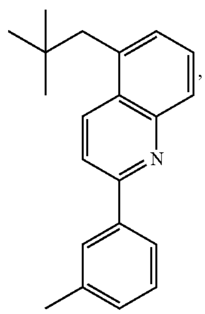
$L_{b33}$
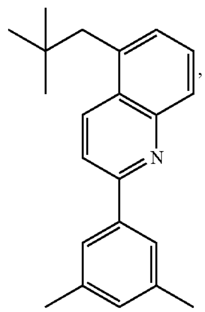
-continued
$L_{b34}$
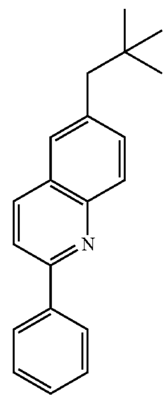
$L_{b35}$
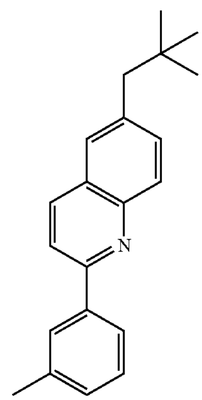
$L_{b36}$
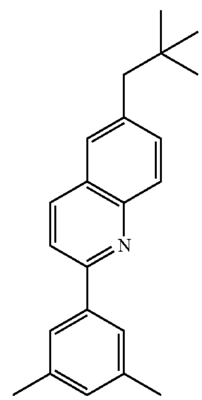
$L_{b37}$
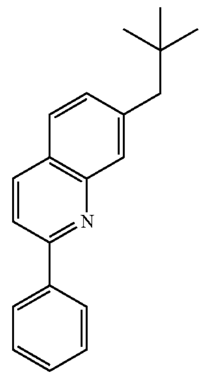

-continued
$L_{b38}$
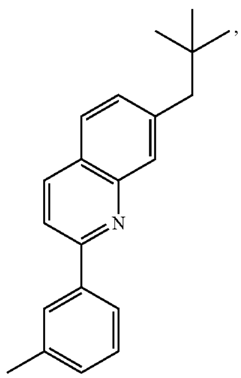
$L_{b39}$
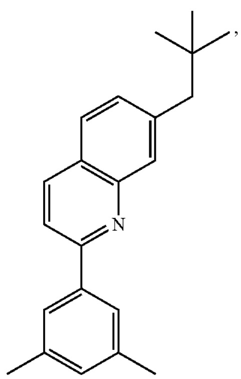
$L_{b40}$
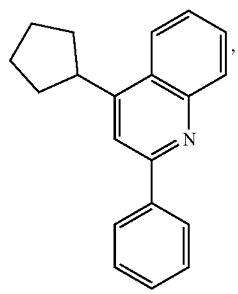
$L_{b41}$
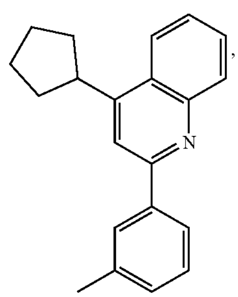
$L_{b42}$
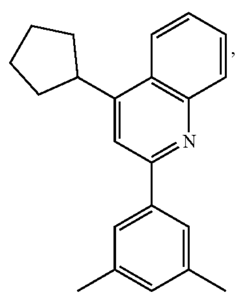
-continued
$L_{b43}$
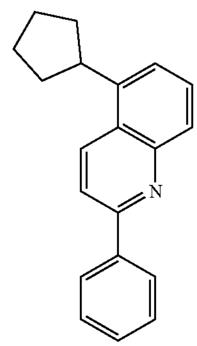
$L_{b44}$
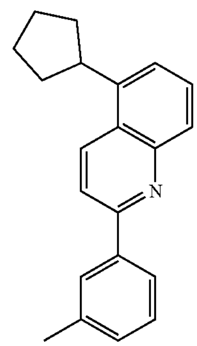
$L_{b45}$
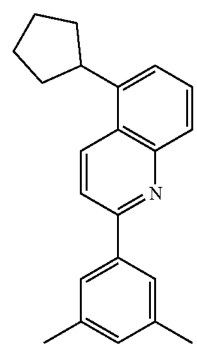
$L_{b46}$
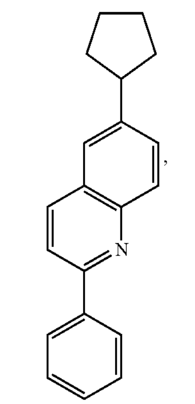

-continued
$L_{b47}$
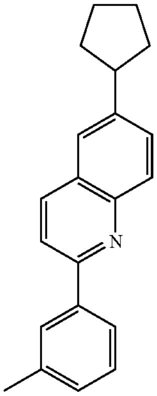
,
$L_{b48}$
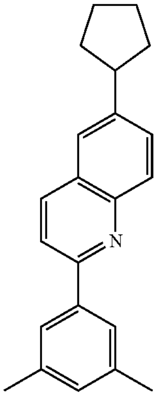
,
$L_{b49}$
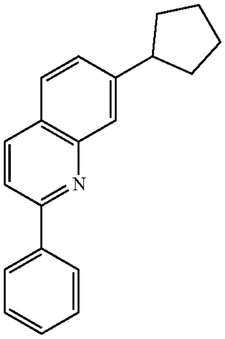
,
$L_{b50}$
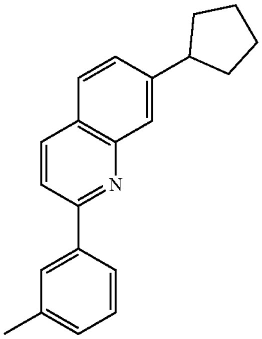
,
-continued
$L_{b51}$
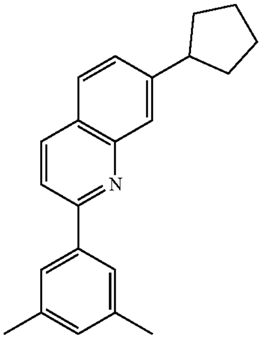
,
$L_{b52}$
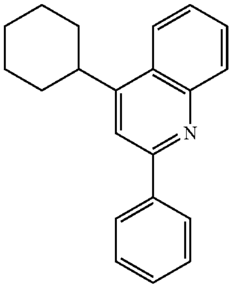
,
$L_{b53}$
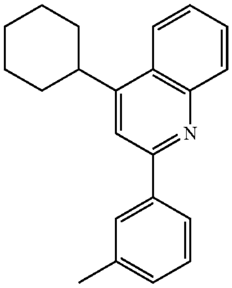
,
$L_{b54}$
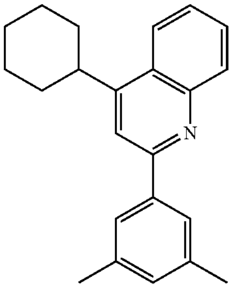
,
$L_{b55}$
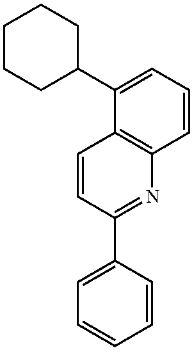
, -continued
$L_{b56}$
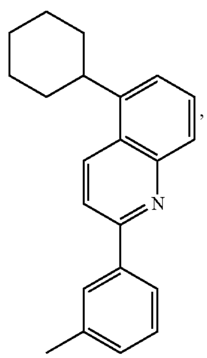
$L_{b57}$
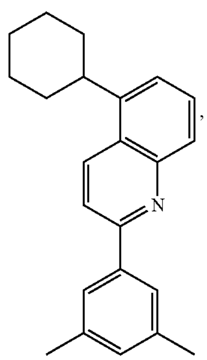
$L_{b58}$
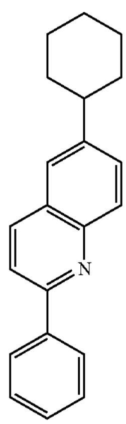
$L_{b59}$
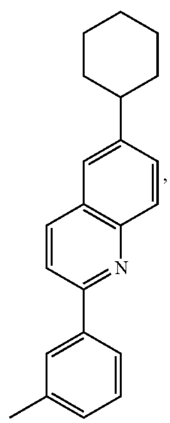
-continued
$L_{b60}$
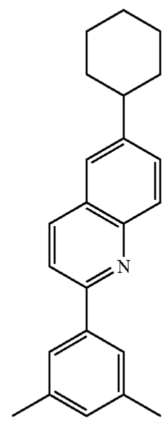
$L_{b61}$
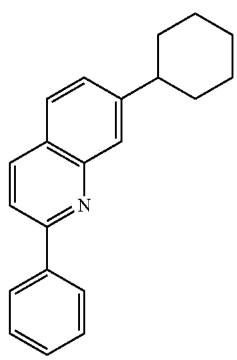
$L_{b62}$
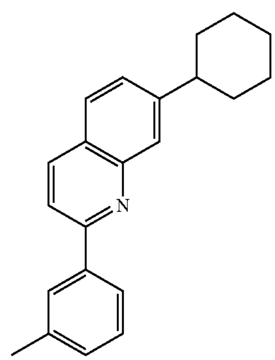
$L_{b63}$
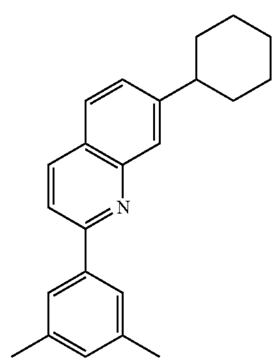

-continued
$L_{b64}$
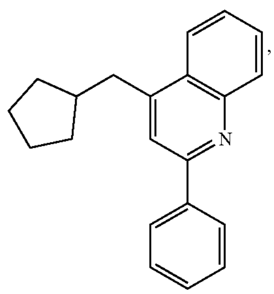
$L_{b65}$
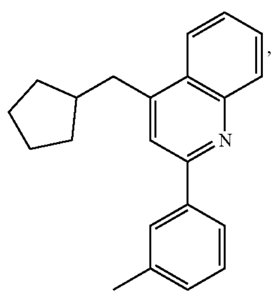
$L_{b66}$
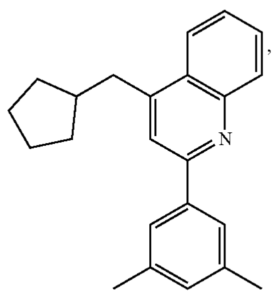
$L_{b67}$
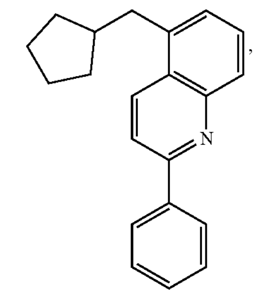
$L_{b68}$
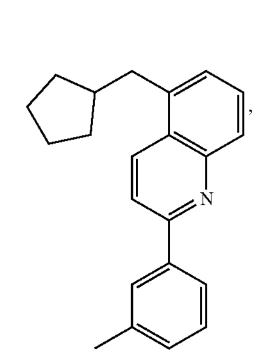
-continued
$L_{b69}$
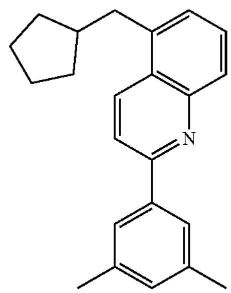
$L_{b70}$
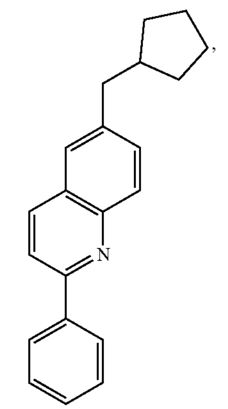
$L_{b71}$
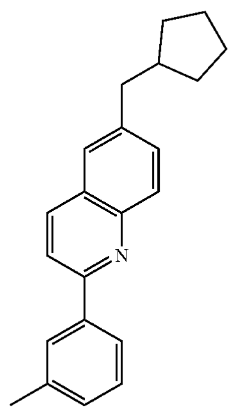
$L_{b72}$
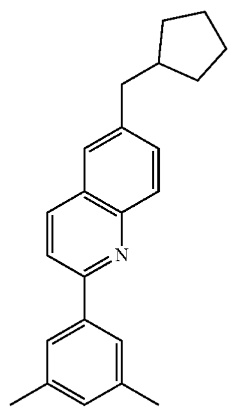

-continued
$L_{b73}$
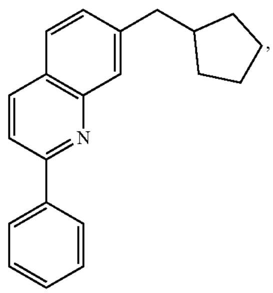
$L_{b74}$
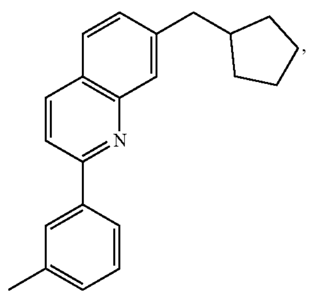
$L_{b75}$
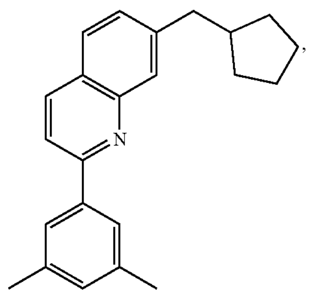
$L_{b76}$
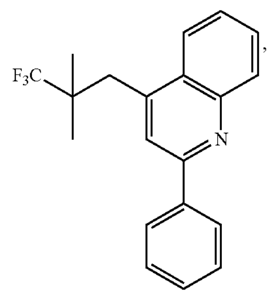
$L_{b77}$
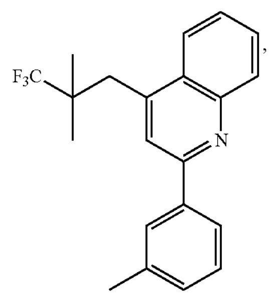
-continued
$L_{b78}$
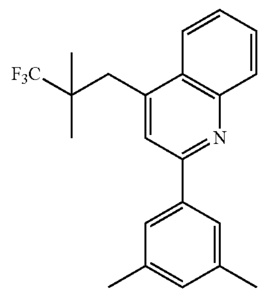
$L_{b79}$
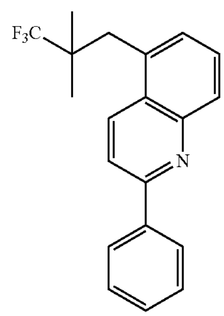
$L_{b80}$
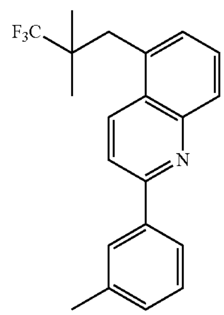
$L_{b81}$
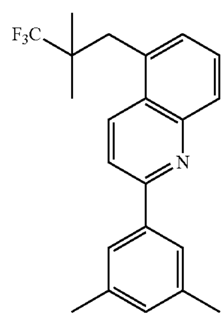
$L_{b82}$
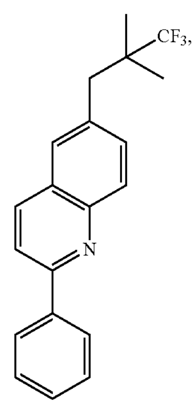

-continued
$L_{b83}$
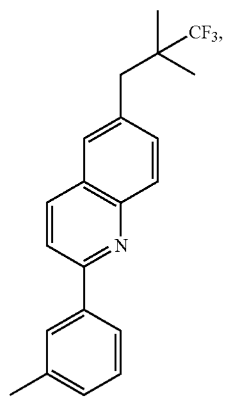
$L_{b84}$
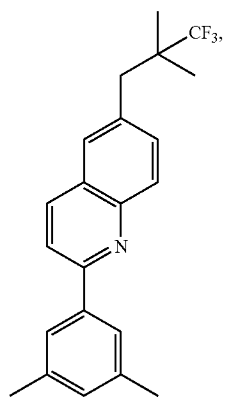
$L_{b85}$
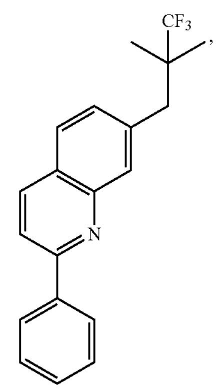
$L_{b86}$
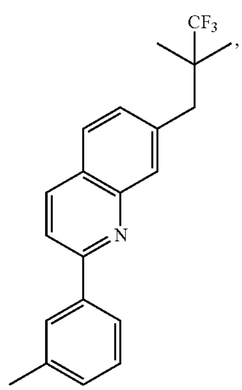
-continued
$L_{b87}$
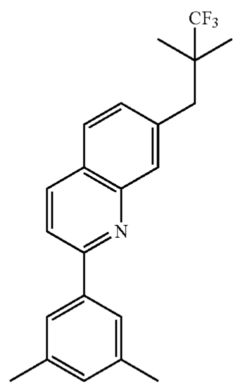
$L_{b88}$
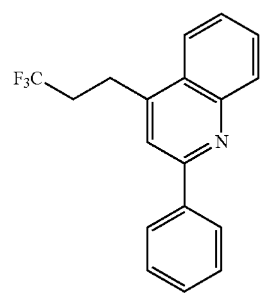
$L_{b89}$
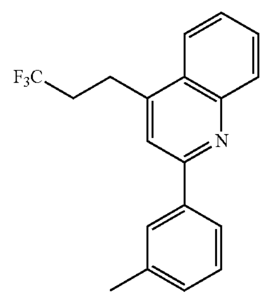
$L_{b90}$
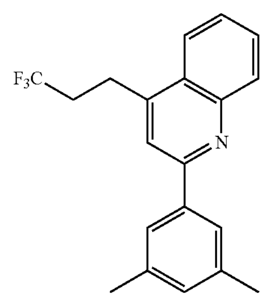
$L_{b91}$
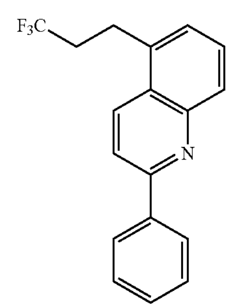

-continued
L$_{b92}$
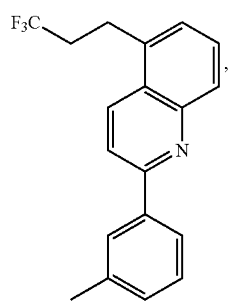
L$_{b93}$
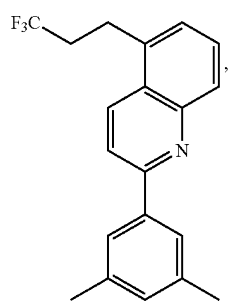
L$_{b94}$
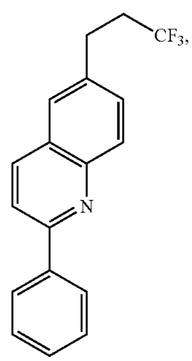
L$_{b95}$
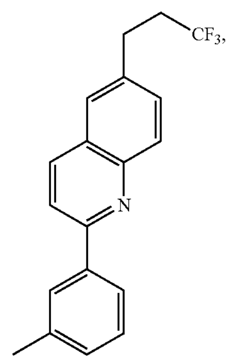
-continued
L$_{b96}$
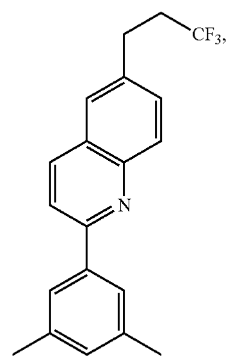
L$_{b97}$
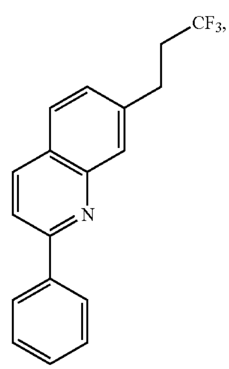
L$_{b98}$
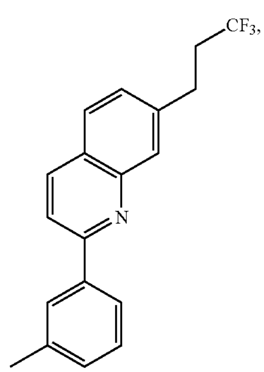
L$_{b99}$
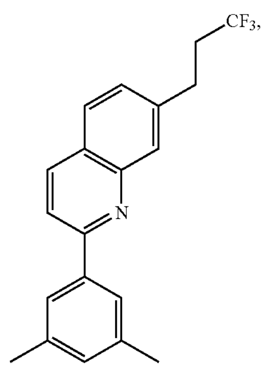

-continued
$L_{b100}$
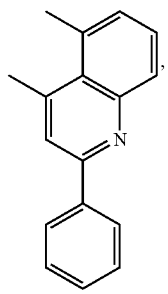
$L_{b101}$
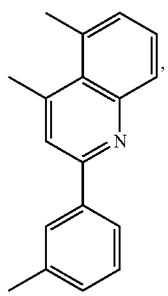
$L_{b102}$
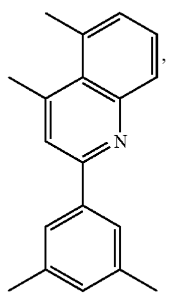
$L_{b103}$
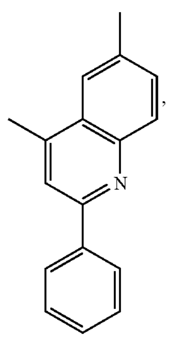
$L_{b104}$
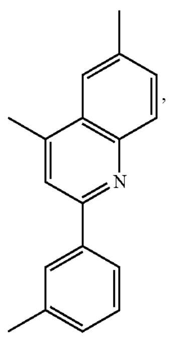
-continued
$L_{b105}$
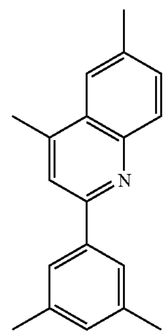
$L_{b106}$
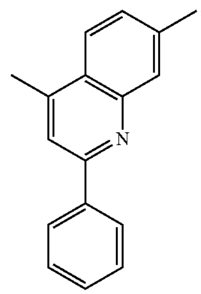
$L_{b107}$
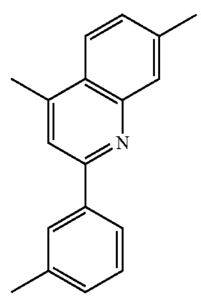
$L_{b108}$
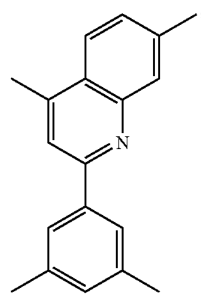
$L_{b109}$
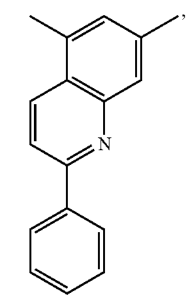

-continued
$L_{b110}$
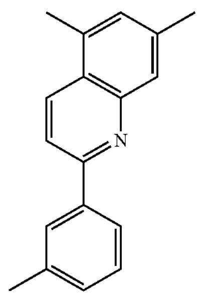
$L_{b111}$
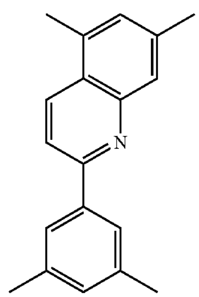
$L_{b112}$
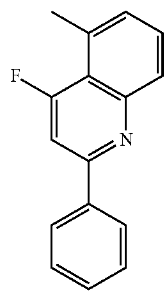
$L_{b113}$
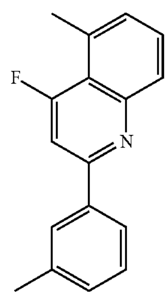
$L_{b114}$
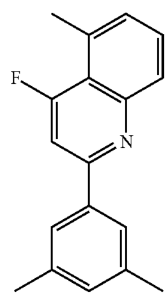
-continued
$L_{b115}$
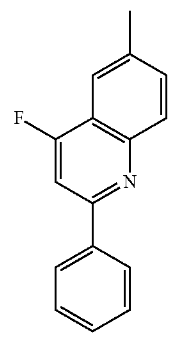
,
$L_{b116}$
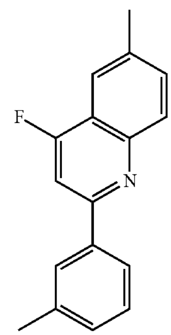
,
$L_{b117}$
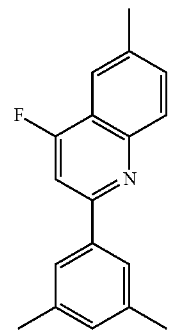
,
$L_{b118}$
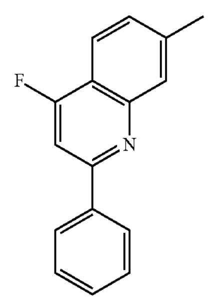
,
$L_{b119}$
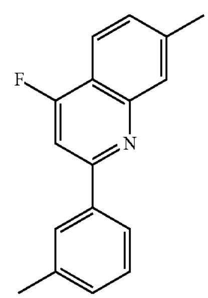
, -continued
$L_{b120}$
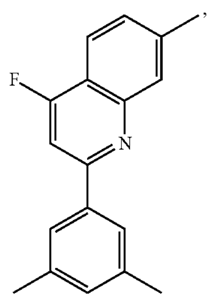
$L_{b121}$
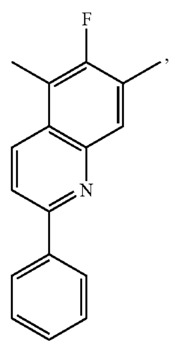
$L_{b122}$
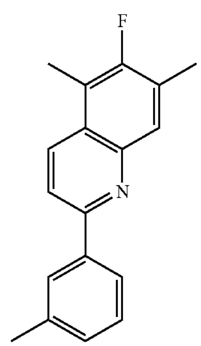
$L_{b123}$
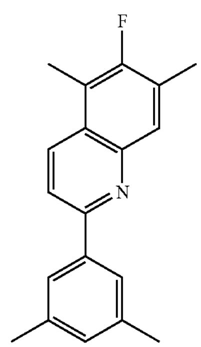
$L_{b124}$
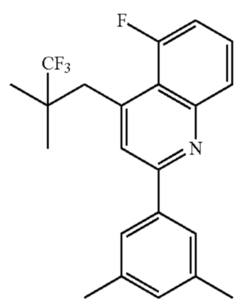
-continued
$L_{b125}$
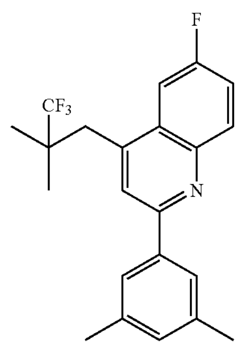
$L_{b126}$
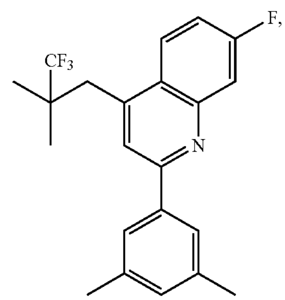
$L_{b127}$
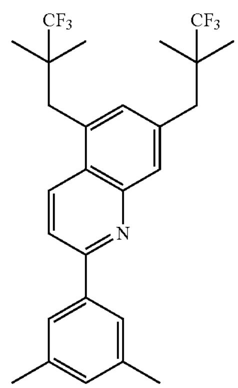
$L_{b128}$
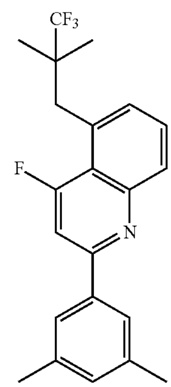

-continued
$L_{b129}$
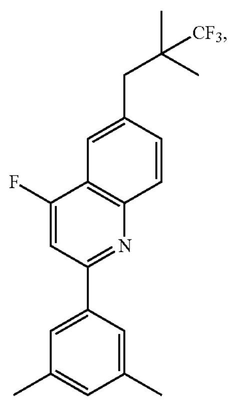
$L_{b130}$
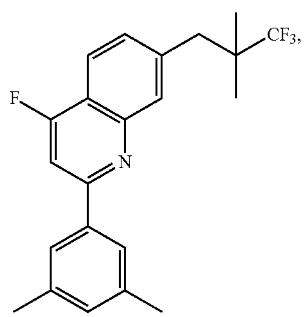
$L_{b131}$
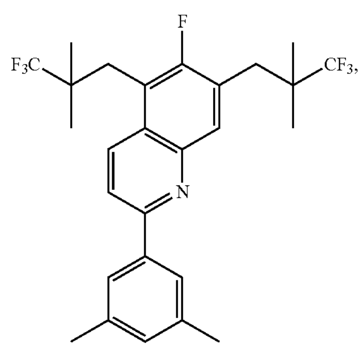
$L_{b132}$
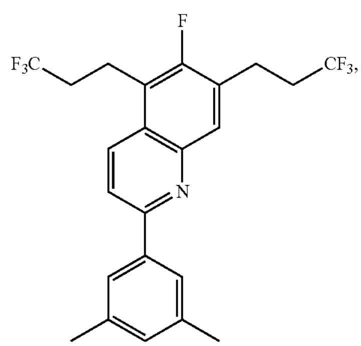
-continued
$L_{b133}$
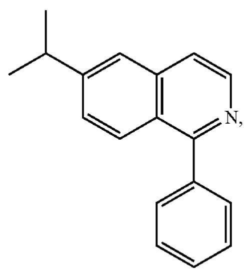
$L_{b134}$
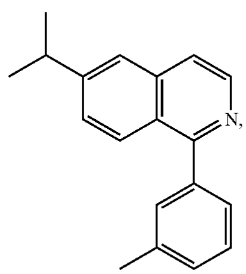
$L_{b135}$
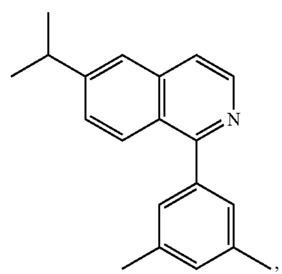
$L_{b136}$
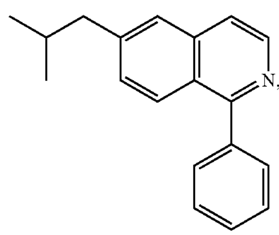
$L_{b137}$
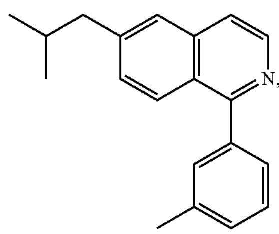
$L_{b138}$
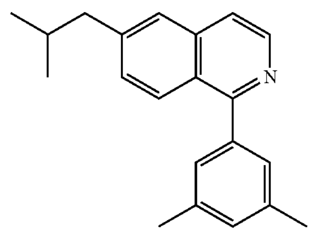

-continued
$L_{b139}$
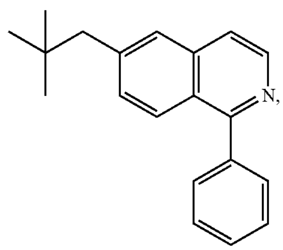
$L_{b140}$
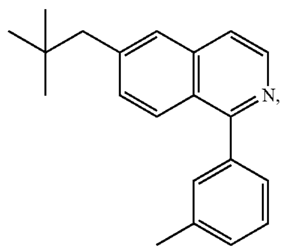
$L_{b141}$
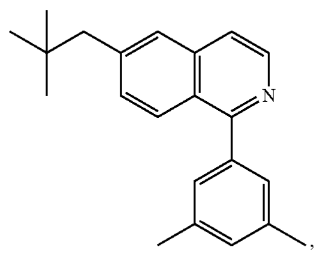
$L_{b142}$
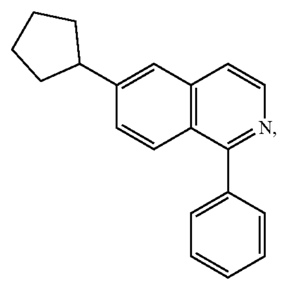
$L_{b143}$
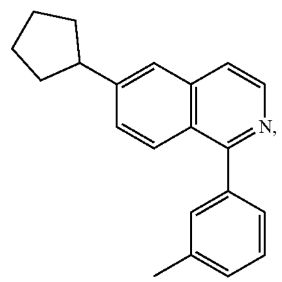
$L_{b144}$
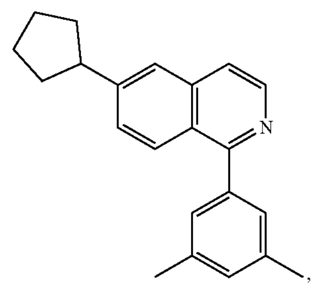
-continued
$L_{b145}$
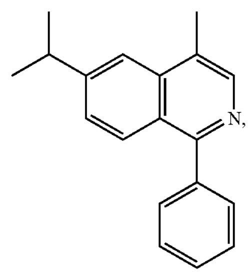
$L_{b146}$
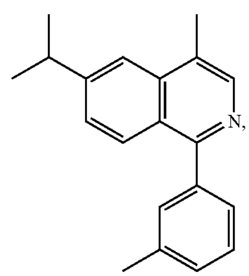
$L_{b147}$
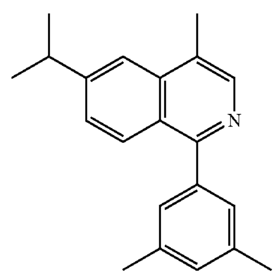
$L_{b148}$
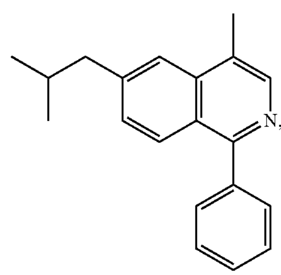
$L_{b149}$
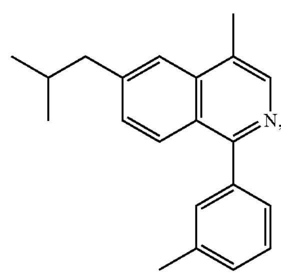

-continued
$L_{b150}$
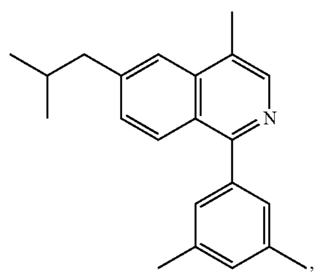
$L_{b151}$
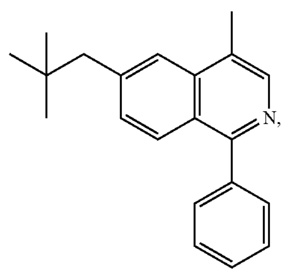
$L_{b152}$
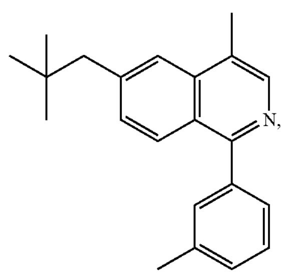
$L_{b153}$
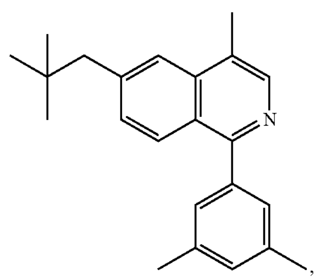
$L_{b154}$
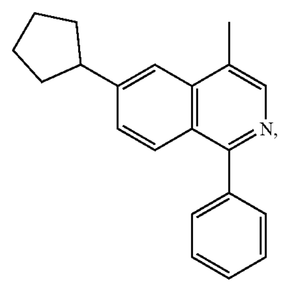
-continued
$L_{b155}$
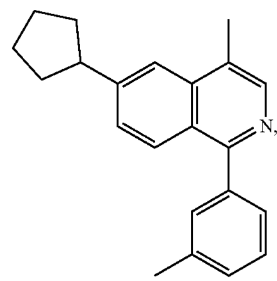
$L_{b156}$
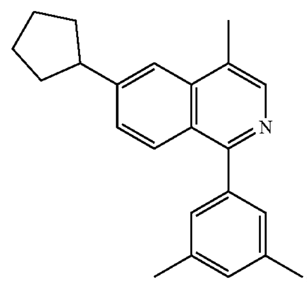
$L_{b157}$
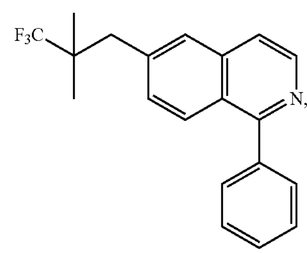
$L_{b158}$
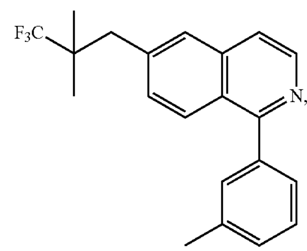
$L_{b159}$
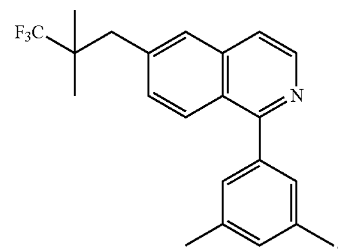
$L_{b160}$
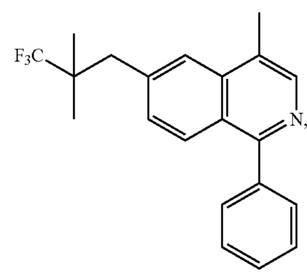

$L_{b161}$
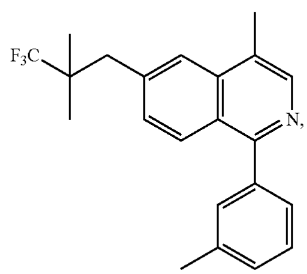
$L_{b162}$
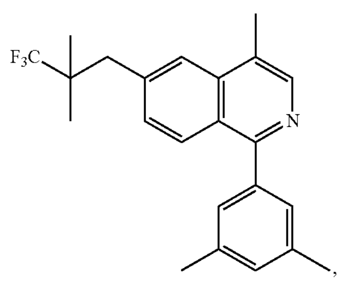
$L_{b163}$
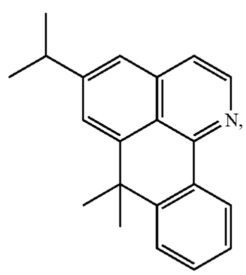
$L_{b164}$
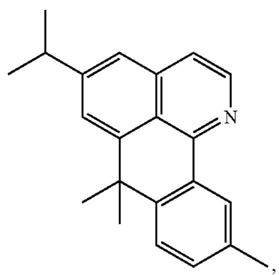
$L_{b165}$
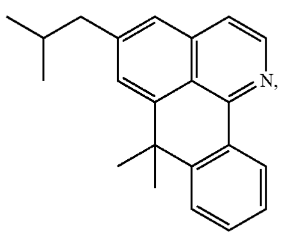
$L_{b166}$
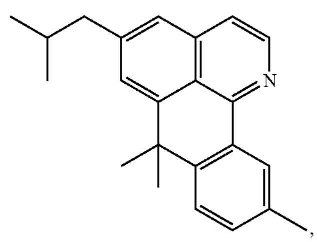
$L_{b167}$
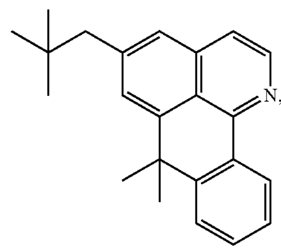
$L_{b168}$
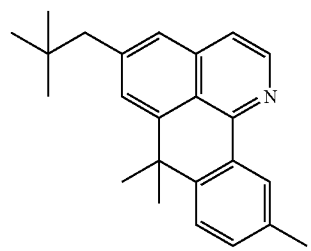
$L_{b169}$
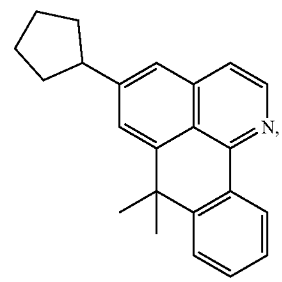
$L_{b170}$
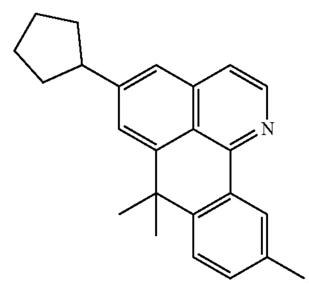
$L_{b171}$
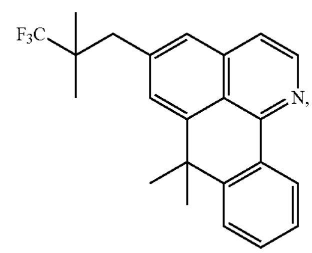
$L_{b172}$
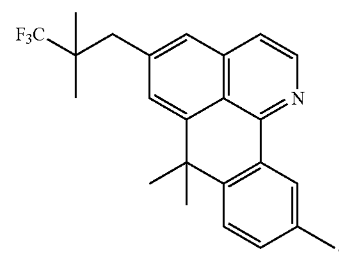

-continued
$L_{b173}$
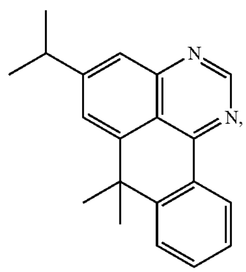
$L_{b174}$
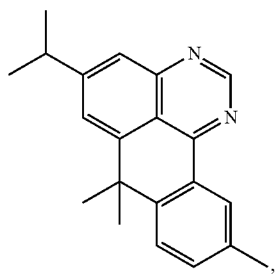
$L_{b175}$
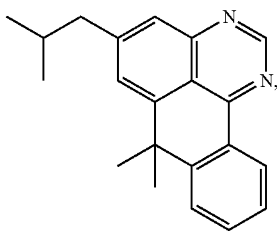
$L_{b176}$
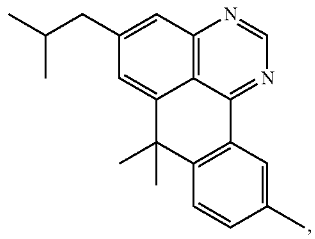
$L_{b177}$
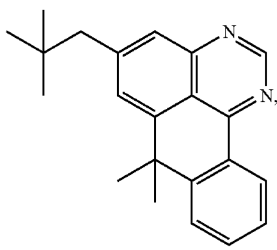
$L_{b178}$
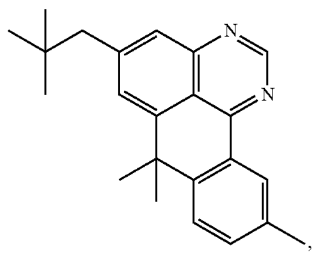
-continued
$L_{b179}$
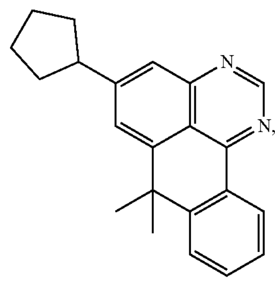
$L_{b180}$
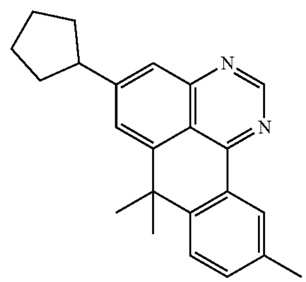
$L_{b181}$
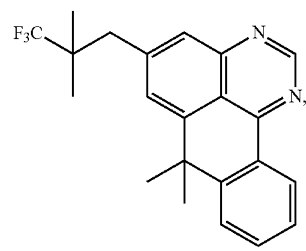
$L_{b182}$
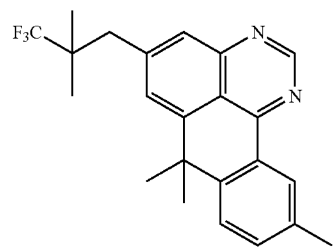
$L_{b183}$
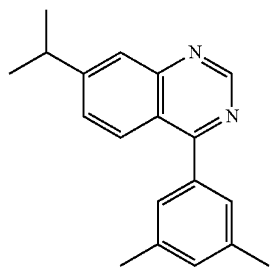

-continued
$L_{b184}$
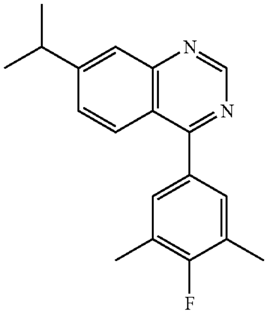
$L_{b185}$
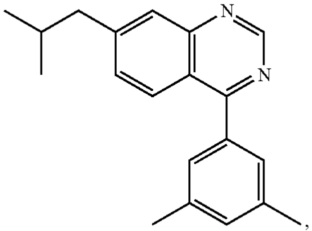
$L_{b186}$
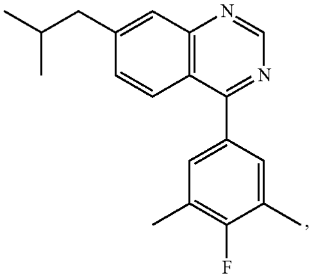
$L_{b187}$
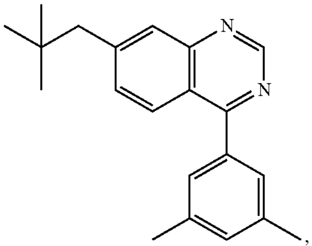
$L_{b188}$
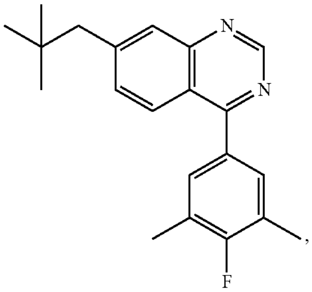
-continued
$L_{b189}$
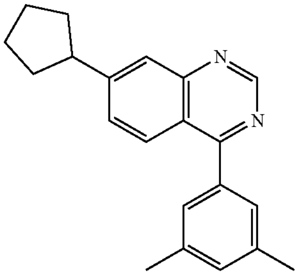
$L_{b190}$
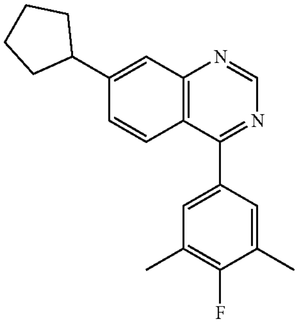
$L_{b191}$
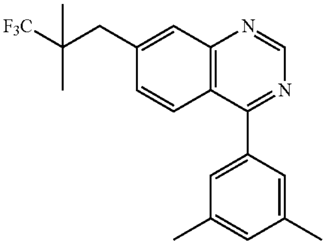
$L_{b192}$
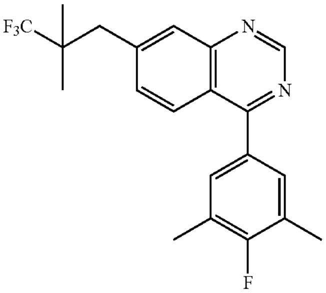
$L_{b193}$
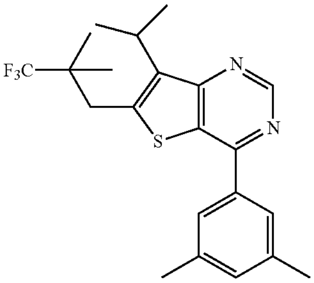

-continued $L_{b194}$

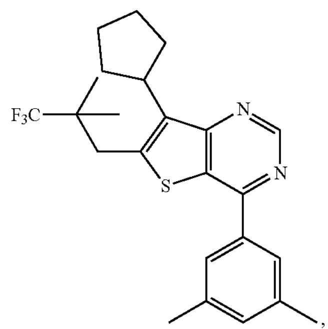

$L_{b195}$

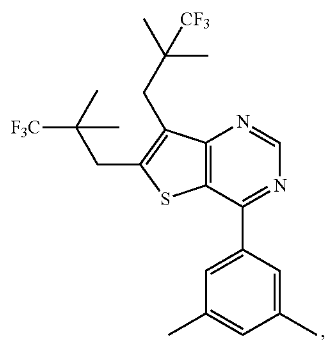

$L_{b196}$

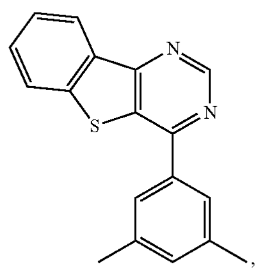

$L_{b197}$

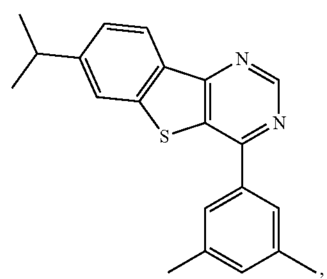

$L_{b198}$

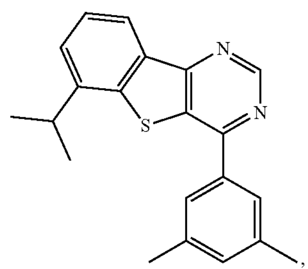

-continued $L_{b199}$

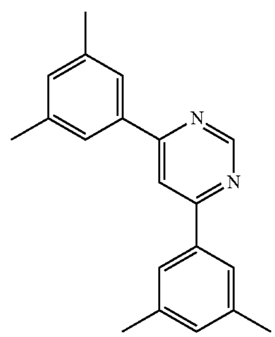

$L_{b200}$

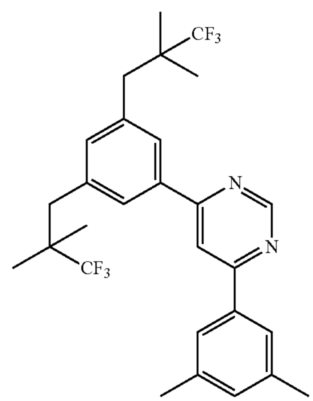

$L_{b201}$

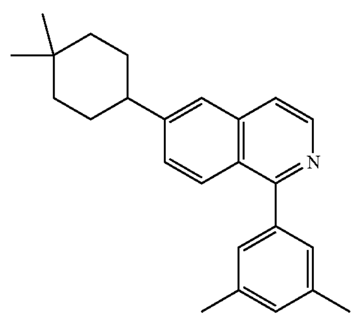

In one embodiment, wherein $L_a$ and $L_b$ can be partially or fully deuterated.

In one embodiment, the metal complex has the formula of $Ir(L_a)(L_b)_2$, wherein $L_a$ is selected from any one of $L_{a1}$ to $L_{a154}$, and $L_b$ is selected from any one or both of $L_{b1}$ to $L_{b201}$.

According to another embodiment, an electroluminescent device is disclosed. The electroluminescent device comprises: an anode, a cathode, and an organic layer, disposed between the anode and the cathode, comprising a metal complex comprising a ligand $L_a$ with formula 1:

Formula 1

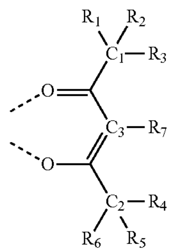

Wherein $C_1$, $C_2$, and $C_3$ are carbon atoms;

$R_1$, $R_2$, $R_3$, $R_4$, $R_5$, $R_6$, and $R_7$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

at least one of $R_1$, $R_2$, $R_3$, $R_4$, $R_5$, $R_6$, and $R_7$ contains at least one fluorine atom, and the fluorine atom is not directly connected to $C_1$, $C_2$, or $C_3$ two adjacent substituents are optionally joined to form a ring.

In one embodiment, wherein the organic layer is the emissive layer and the metal complex is the emitter.

In one embodiment, wherein the device emits red light.

In one embodiment, wherein the device emits white light.

In one embodiment, wherein the organic layer further comprises a host compound.

In one embodiment, wherein the organic layer further comprises a host compound, and the host compound comprises a donor part and an acceptor part.

In one embodiment, wherein the organic layer further comprises a host compound, and the host compound comprises at least one chemical group selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and the combinations thereof.

According to yet another embodiment, a formulation comprising a metal complex having a ligand $L_a$ represented by Formula 1 is also disclosed. The ligand $L_a$ of formula 1 is described above.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing the compounds of the present invention is not limited. The following compounds is exemplified as a typical but non-limiting example, and its synthesis route and preparation method are as follows:

1. Synthesis of Compound $Ir(L_{a74})(L_{b201})_2$

Synthesis of Iridium Dimer.

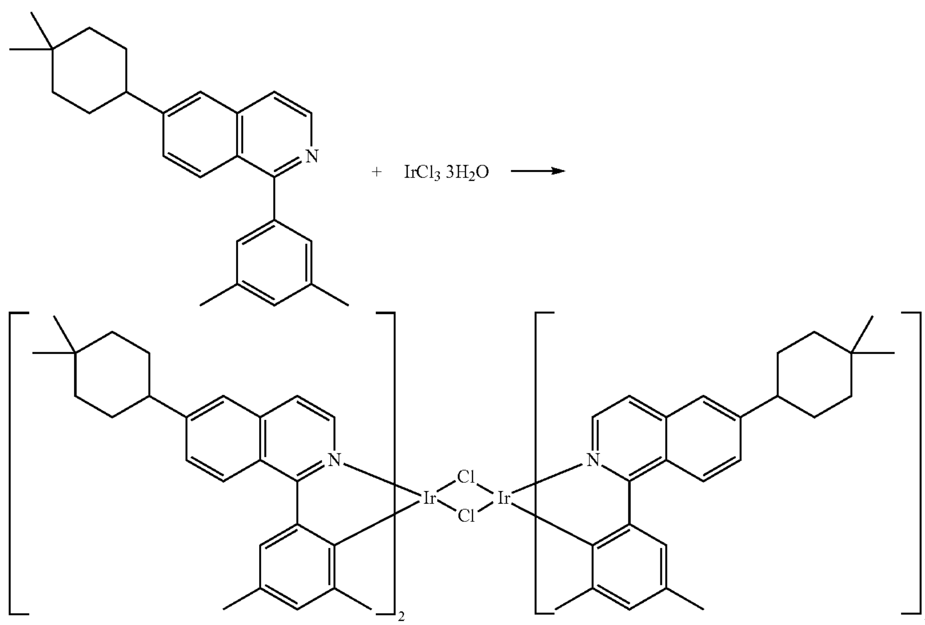

A mixture of 6-(4,4-dimethylcyclohexyl)-1-(3,5-dimethylphenyl)isoquinoline (3.0 g, 2.76 mmol), $IrCl_3 \cdot 3H_2O$ (770 mg, 2.19 mmol), 2-ethoxyethanol (52 mL) and water (17 mL) was refluxed under nitrogen for 24 h. After cooling to room temperature, the solvent was removed under reduced pressure to give the iridium dimer that was used in next step without further purification.

Synthesis of Compound $Ir(L_{a74})(L_{b201})_2$.

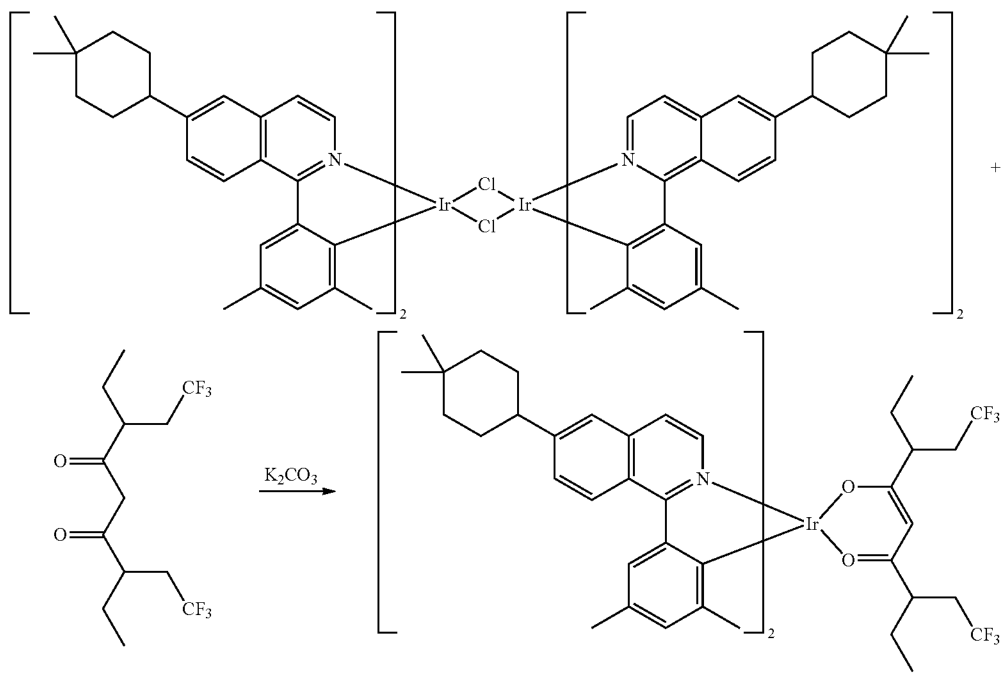

A mixture of dimer (1.1 mmol), 3,7-diethyl-1,1,1,9,9,9-hexafluorononane-4,6-dione (2.8 g, 8.76 mmol), $K_2CO_3$ (1.511 g, 10.95 mmol), and 2-ethoxyethanol (30 mL) were stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 1.5 g product was obtained after filtration. The product was further purified by column chromatography. The structure of the compound was confirmed by NMR and LC-MS. The compound molecular weight is 1196, identified as the target product.

2. Synthesis of Compound $Ir(L_{a75})(L_{b201})_2$

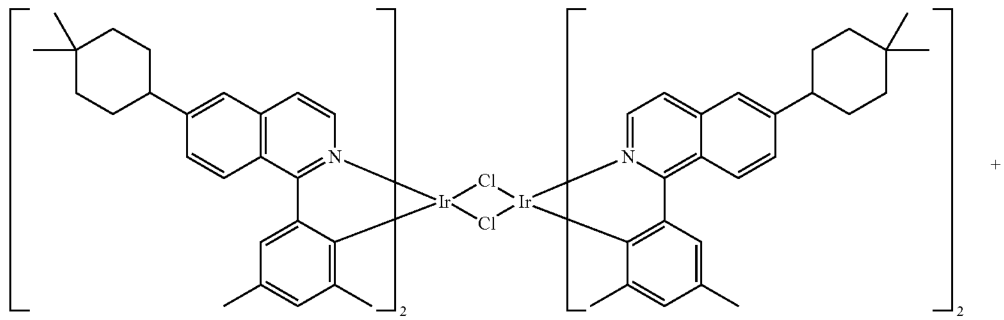

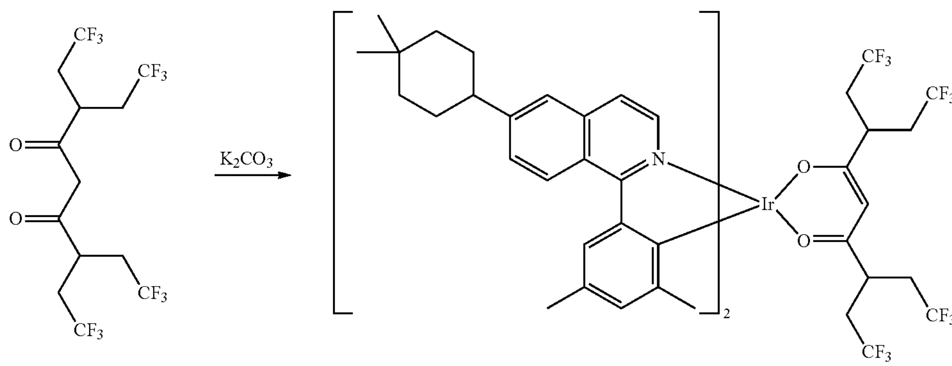

A mixture of dimer (1.1 mmol), 1,1,1,9,9,9-hexafluoro-3,7-bis(2,2,2-trifluoroethyl)nonane-4,6-dione (2.3 g, 6.00 mmol), $K_2CO_3$ (1.511 g, 10.95 mmol), and 2-ethoxyethanol (30 mL) were stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 2.0 g product was obtained after filtration. The product was further purified by column chromatography. The structure of the compound was confirmed by NMR and LC-MS. The compound molecular weight is 1304, identified as the target product.

3. Synthesis of Compound $Ir(L_{a74})(L_{b138})_2$

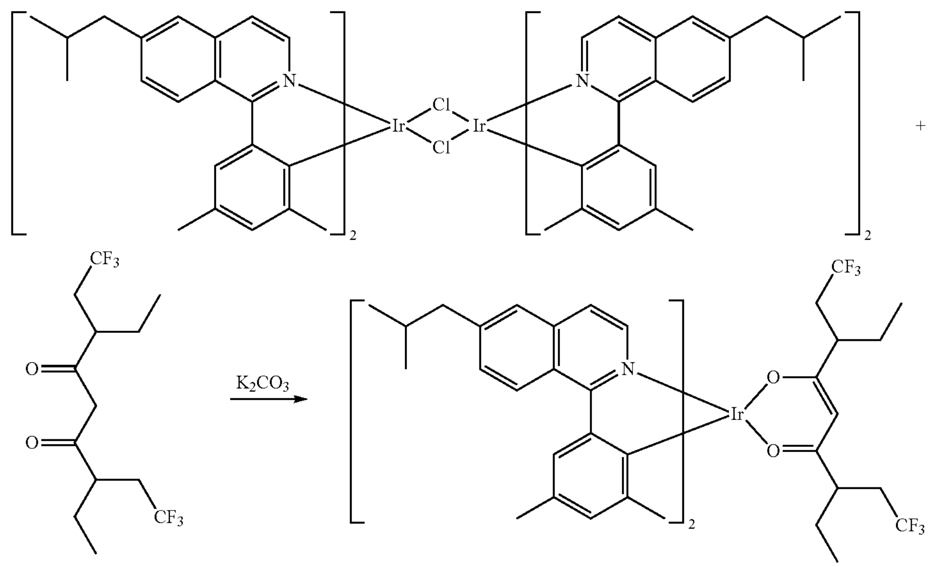

A mixture of dimer (1.3 mmol), 3,7-diethyl-1,1,1,9,9,9-hexafluorononane-4,6-dione (4.1 g, 13 mmol), $K_2CO_3$ (1.7 g, 13 mmol), and 2-ethoxyethanol (30 mL) were stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 1.3 g product was obtained after filtration. The structure of the compound was confirmed by NMR and LC-MS. The compound molecular weight is 1088, identified as the target product.

4. Synthesis of Compound $Ir(L_{a74})(L_{b3})_2$

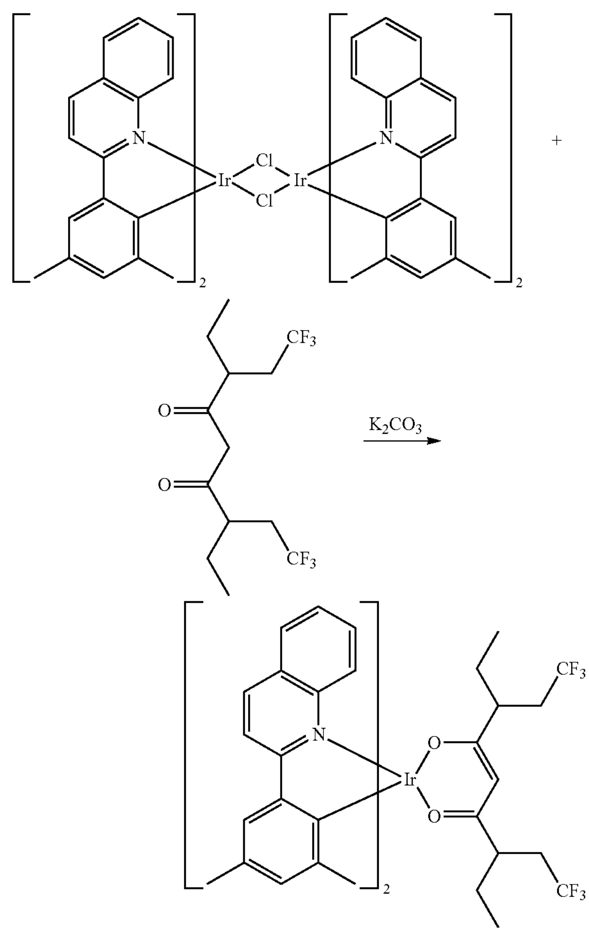

A mixture of dimer (1.15 mmol), 3,7-diethyl-1,1,1,9,9,9-hexafluorononane-4,6-dione (1.46 g 4.6 mmol), $K_2CO_3$ (1.58 g, 11.5 mmol), and 2-ethoxyethanol (32 mL) was stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 1.5 g product was obtained after filtration. The structure of the compound was confirmed by NMR and LC-MS. The compound molecular weight is 976, identified as the target product.

The persons skilled in the art should know that the above preparation method is only an illustrative example, and the persons skilled in the art can obtain the structure of other compounds of the present invention by modifying the above preparation method.

Device Examples:

A glass substrate with 120 nm thick indium-tin-oxide (ITO) anode was first cleaned and then treated with oxygen plasma and UV ozone. After the treatments, the substrate was baked dry in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum of around $10^{-8}$ torr. Compound HI was used as the hole injection layer (HIL). Compound HT was used as the hole transporting layer (HTL). Compound EB was used as the electron blocking layer (EBL). Then the inventive compound or the comparative compound was doped in the host Compound RH as the emitting layer (EML). Compound HB was used as the hole blocking layer (HBL). On the HBL, a mixture of Compound ET and 8-Hydroxyquinolinolato-lithium(Liq) was deposited as the electron transporting layer (ETL). Finally, 1 nm-thick Liq was deposited as the electron injection layer and 120 nm of Al was deposited as the cathode. The device was then transferred back to the glovebox and encapsulated with a glass lid and a moisture getter to complete the device.

The detailed device layer structure and thicknesses are shown in the table below. In the layers in which more than one materials were used, they were obtained by doping different compounds in the weight ratios described therein.

TABLE 1

Device structure of device examples

| Device ID | HIL | HTL | EBL | EML | HBL | ETL |
|---|---|---|---|---|---|---|
| Example 1 | Compound HI (100 Å) | Compound HT (400 Å) | Compound EB (50 Å) | Compound RH:Compound $Ir(L_{a74})(L_{b201})_2$ (95:5) (400 Å) | Compound HB (50 Å) | Compound ET:Liq (35:65) (350 Å) |
| Example 2 | Compound HI (100 Å) | Compound HT (400 Å) | Compound EB (50 Å) | Compound RH:Compound $Ir(L_{a75})(L_{b201})_2$ (95:5) (400 Å) | Compound HB (50 Å) | Compound ET:Liq (35:65) (350 Å) |
| Comparative Example 1 | Compound HI (100 Å) | Compound HT (400 Å) | Compound EB (50 Å) | Compound RH:Compound A (95:5) (400 Å) | Compound HB (50 Å) | Compound ET:Liq (35:65) (350 Å) |

TABLE 1-continued

| Device structure of device examples | | | | | | |
|---|---|---|---|---|---|---|
| Device ID | HIL | HTL | EBL | EML | HBL | ETL |
| Example 3 | Compound HI (100 Å) | Compound HT (400 Å) | Compound EB (50 Å) | Compound RH:Compound $Ir(L_{a74})(L_{b3})_2$ (95:5) (400 Å) | Compound HB (50 Å) | Compound ET:Liq (35:65) (350 Å) |
| Comparative Example 2 | Compound HI (100 Å) | Compound HT (400 Å) | Compound EB (50 Å) | Compound RH:Compound B (95:5) (400 Å) | Compound HB (50 Å) | Compound ET:Liq (35:65) (350 Å) |
| Comparative Example 3 | Compound HI (100 Å) | Compound HT (400 Å) | Compound EB (50 Å) | Compound RH:Compound C (95:5) (400 Å) | Compound HB (50 Å) | Compound ET:Liq (35:65) (350 Å) |

The structures of the materials used in the devices are shown below:

Compound HI

Compound HT

Compound EB

-continued

Compound HB

Compound RH

Compound ET

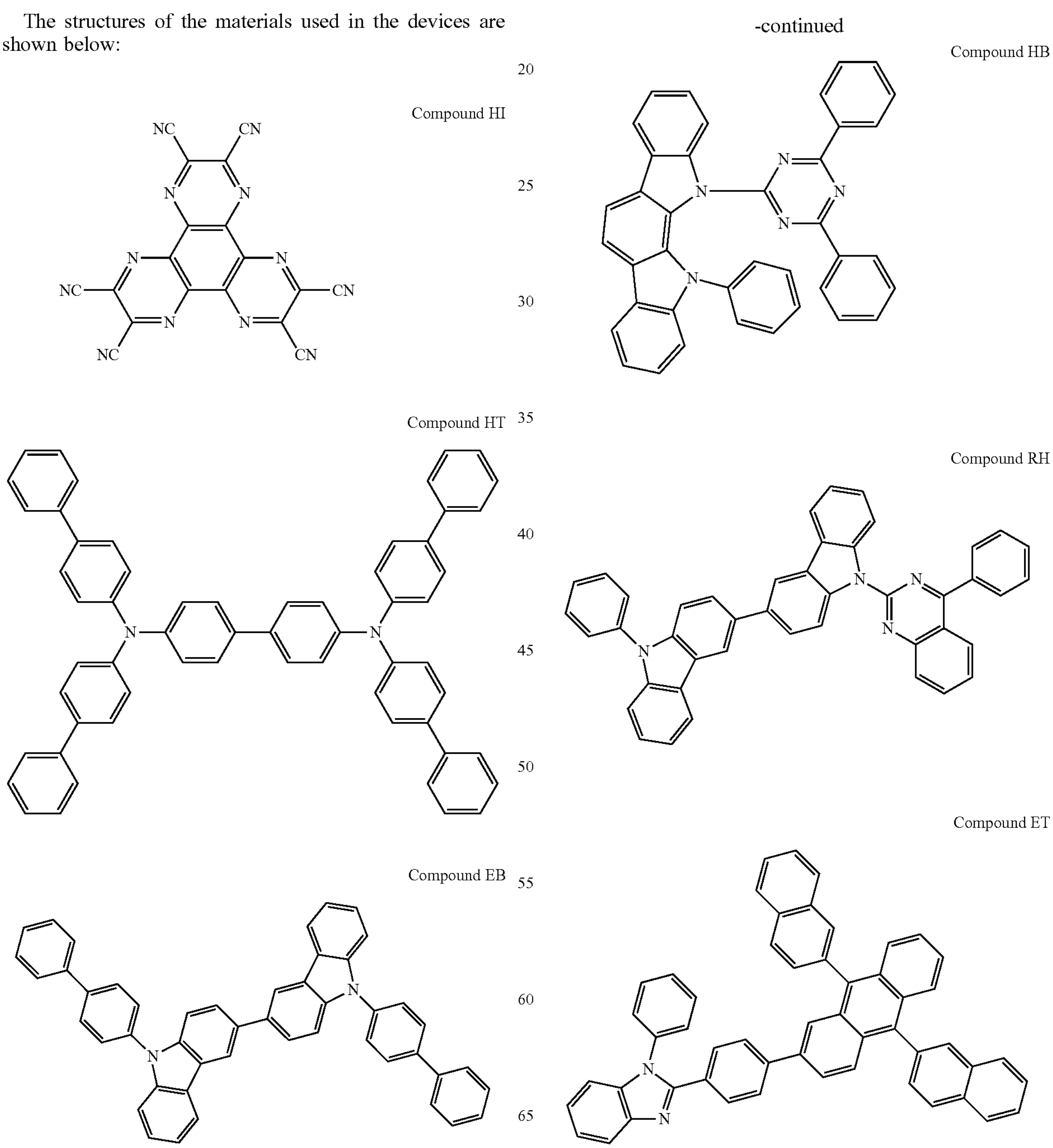

-continued

Compound A

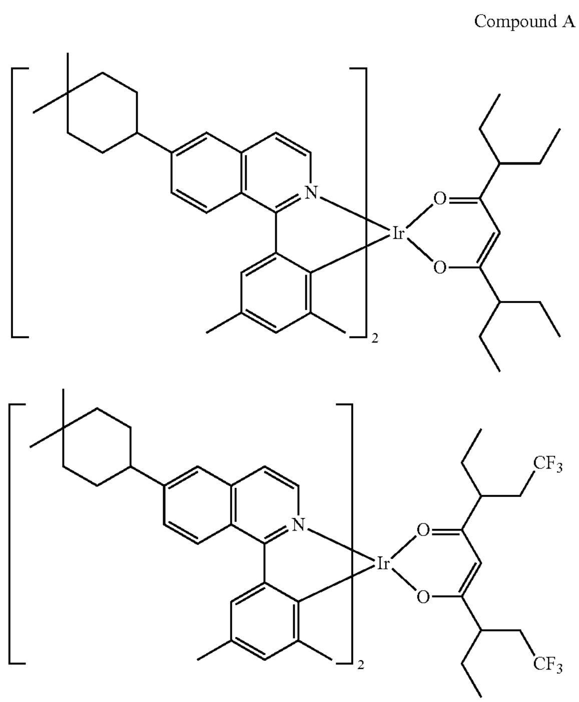

Compound Ir($L_{a74}$)($L_{b201}$)$_2$

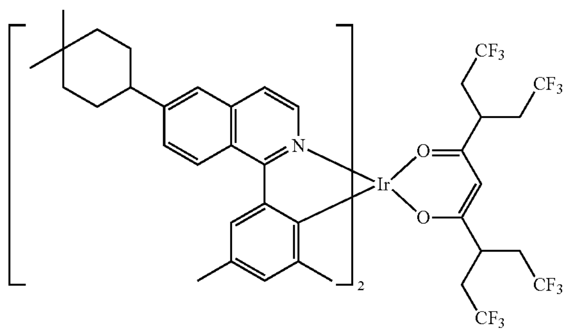

Compound Ir($L_{a75}$)($L_{b201}$)$_2$

Compound B

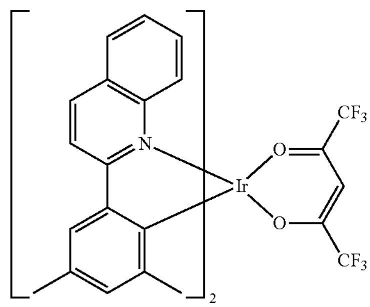

-continued

Compound C

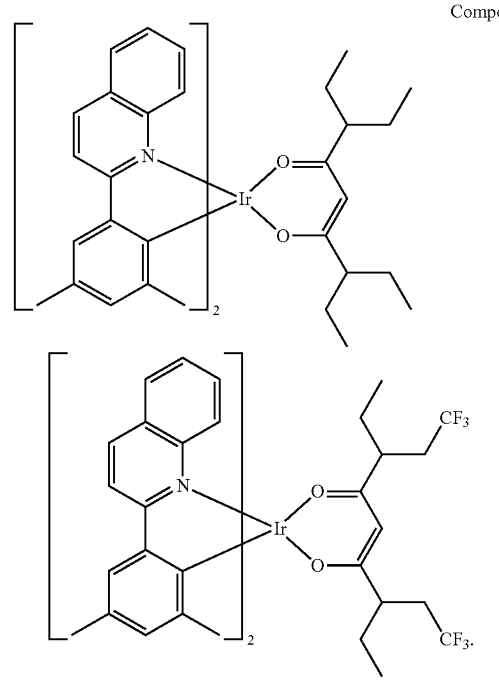

Compound Ir($L_{a74}$)($L_{b3}$)$_2$

The IVL and lifetime characteristics of the devices were measured at various current densities and voltages. The luminance efficiency (LE), λ max, full width at half maximum (FWHM), voltage (V) and CIE data were measured at 1000 nits. The sublimation temperature (Sub T) of the material was tested.

TABLE 2

| Device data | | | | | | |
|---|---|---|---|---|---|---|
| Device ID | Sub T (° C.) | CIE (x, y) | λmax (nm) | FWHM (nm) | Voltage (V) | LE (cd/A) |
| Example 1 | 247 | (0.672, 0.327) | 619 | 48 | 3.73 | 27 |
| Example 2 | 220 | (0.653, 0.344) | 612 | 48 | 3.43 | 27 |
| Comparative Example 1 | 260 | (0.683, 0.316) | 624 | 48 | 4.13 | 24 |
| Example 3 | 190 | (0.644, 0.354) | 610 | 58 | 4.02 | 27 |
| Comparative Example 2 | 196 | (0.346, 0.532) | 532 | 113 | — | — |
| Comparative Example 3 | 193 | (0.660, 0.339) | 617 | 57 | 4.42 | 26 |

Discussion

As can be seen from table 2, device examples with inventive compounds showed several advantages over the comparative compound. Connecting fluorine atoms not directly to the $C_1$, $C_2$ or $C_3$ position in the structure of formula 1 can pull down the HOMO of the complex slightly and fine tune the emission color, which provides a useful tool for color fine tuning. Compared to the comparative compound, the inventive compounds had slightly blue shifted color. The color shift became more significant when the number of fluorine atoms increased. The CIE coordinates shifted from (0.683, 0.316) for the comparative example to (0.672, 0.327) for device example 1 and (0.653, 0.344) for device example 2. The line width (FWHM) of the devices incorporated with inventive compounds remained the same as the comparative compound. However, the luminance efficiency (LE) of the inventive examples was much higher than the comparative example (27 cd/A vs. 24 cd/A). The inventive examples also showed much lower driving voltage than the comparative example, which is more desirable for commercial applications due to its high power efficacy. Furthermore, the inventive compounds showed unexpected lower sublimation temperatures than the comparative compound. The sublimation temperature of the comparative compound A was measured at 260° C., while the inventive compounds Compound $Ir(L_{a74})(L_{b201})_2$ and Compound $Ir(L_{a75})(L_{b201})_2$ had the sublimation temperature of 247° C. and 220° C., respectively. Since the sublimation temperature of a similar class of materials normally correlated to the molecular weight of the compounds, it is very unexpected for the inventive compounds to have such a lower sublimation temperature than the comparative compound. The same trend was observed for Compound $Ir(L_{a74})(L_{b3})_2$ and comparative compound C. Inventive compound $Ir(L_{a74})(L_{b3})_2$ showed high luminance efficiency, lower device voltage and lower sublimation temperature. Comparative Compound B showed very poor performance in the device. The maximum efficiency was less than 1%. The emission from the device was contaminated by other materials probably due to poor charge recombination in the device. The intrinsic PL emission of Compound B had a peak at 590 nm, which is much less saturated than the inventive compound.

It is understood that the various embodiments described herein are by way of example only and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A metal complex comprising a ligand $L_a$ selected from $L_{a39}$:

$L_{a39}$

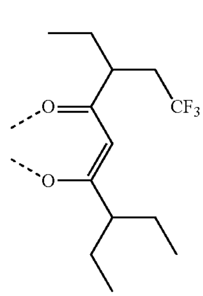

wherein the metal complex has the formula of $M(L_a)_m(L_b)_n$, the metal M is Ir;

wherein $L_b$ is the second ligand coordinating to M, $L_b$ can be the same or different;

$L_a$ and $L_b$ can be optionally joined to form a multidentate ligand;

wherein m is 1, n is 2; m+n is the oxidation state of M;

wherein $L_b$ is independently selected from:

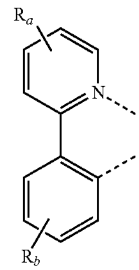

wherein $R_a$ can represent di, tri, or tetra substitution;

$R_b$ can represent mono, di, tri, or tetra substitution or no substitution;

$R_a$ and $R_b$ are each independently selected from the group consisting of hydrogen, deuterium, a substituted or unsubstituted alkyl group having 1 to 20 carbon atoms, a substituted or unsubstituted cycloalkyl group having 3 to 20 ring carbon atoms, an unsubstituted heteroalkyl group having 1 to 20 carbon atoms, a substituted or unsubstituted arylalkyl group having 7 to 30 carbon atoms, an unsubstituted alkoxy group having 1 to 20 carbon atoms, an unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring;

at least two adjacent substituents $R_a$ are joined to form a ring, and the at least two adjacent $R_a$ are each independently selected from the group consisting of a substituted or unsubstituted alkyl group having 1 to 20 carbon atoms, a substituted or unsubstituted cycloalkyl group having 3 to 20 ring carbon atoms, a substituted or unsubstituted arylalkyl group having 7 to 30 carbon atoms, an unsubstituted alkoxy group having 1 to 20 carbon atoms, an unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, an unsubstituted arylsilyl group having 6 to 20 carbon atoms, an unsubstituted amino group having 0 to 20 carbon atoms, a sulfanyl group, and combinations thereof;

in $L_b$, the alkyl, cycloalkyl, alkenyl, alkynyl, aralkyl, aryl, and heteroaryl are unsubstituted or are substituted with one or more substituents selected from the group consisting of deuterium, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.
2. The metal complex of claim 1, wherein the ligand $L_b$ is selected from the group consisting of:
$L_{b1}$
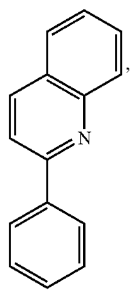
$L_{b2}$
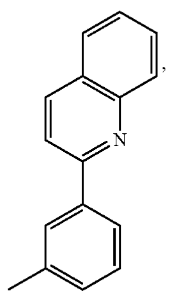
$L_{b3}$
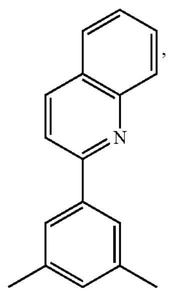
$L_{b4}$
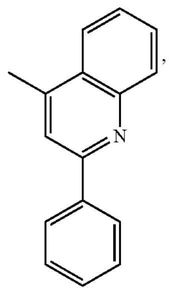
$L_{b5}$
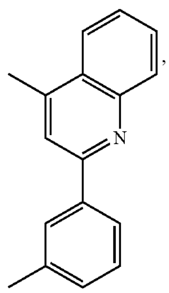
-continued
$L_{b6}$
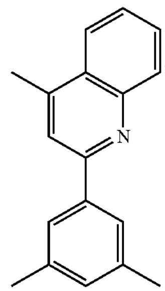
$L_{b7}$
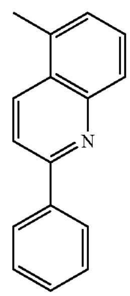
$L_{b8}$
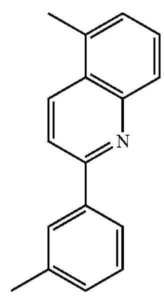
$L_{b9}$
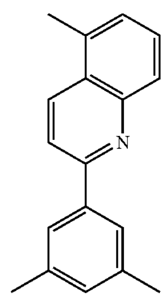
$L_{b10}$
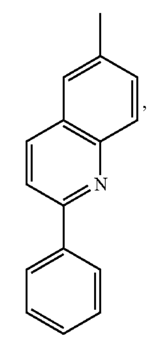

-continued
$L_{b11}$
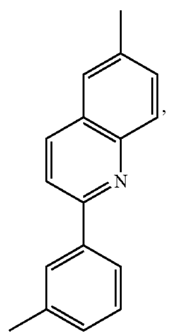
$L_{b12}$
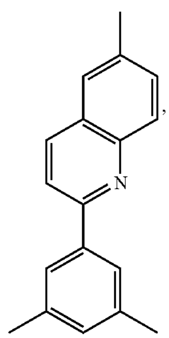
$L_{b13}$
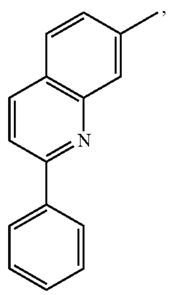
$L_{b14}$
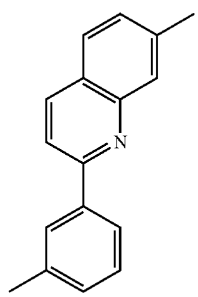
$L_{b15}$
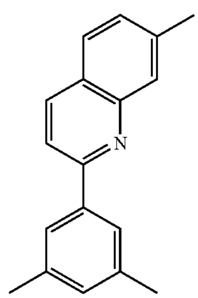
-continued
$L_{b16}$
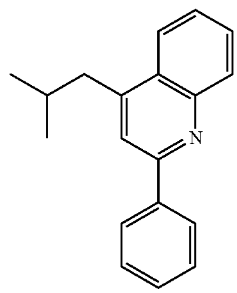
$L_{b17}$
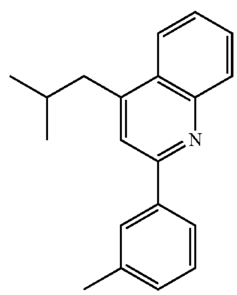
$L_{b18}$
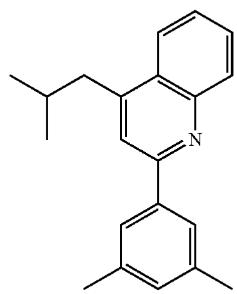
$L_{b19}$
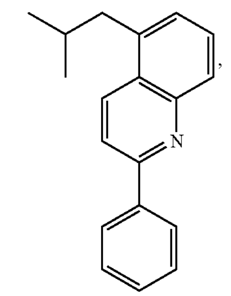
$L_{b20}$
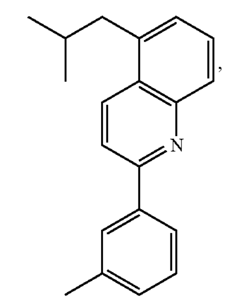

-continued
$L_{b21}$
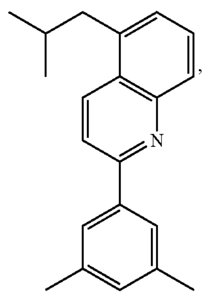
$L_{b22}$
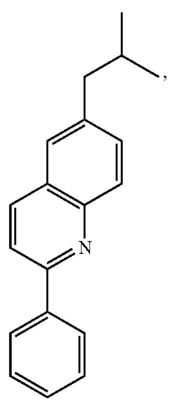
$L_{b23}$
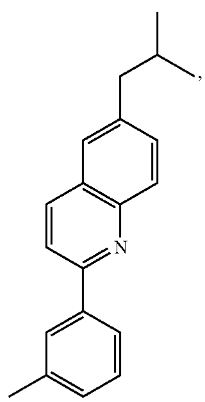
$L_{b24}$
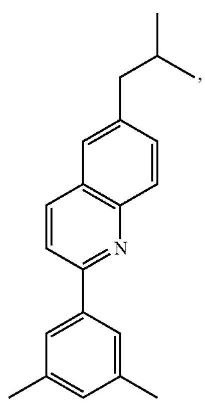
-continued
$L_{b25}$
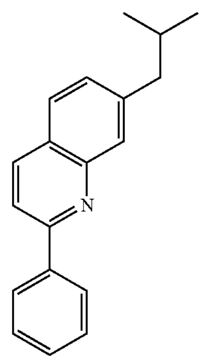
$L_{b26}$
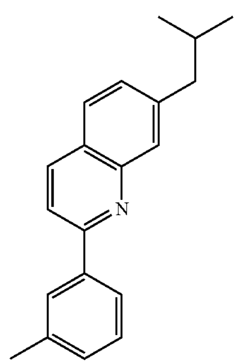
$L_{b27}$
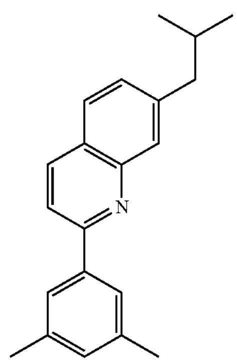
$L_{b28}$
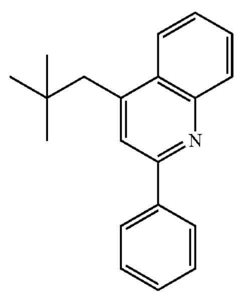

-continued
$L_{b29}$
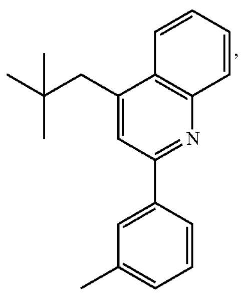
$L_{b30}$
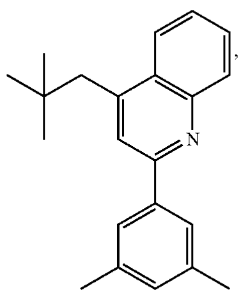
$L_{b31}$
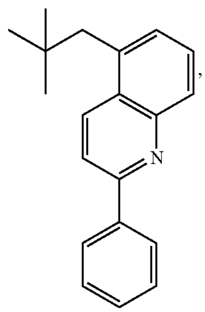
$L_{b32}$
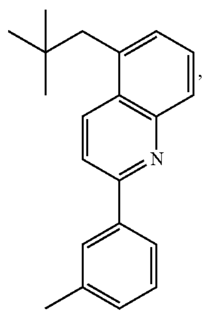
$L_{b33}$
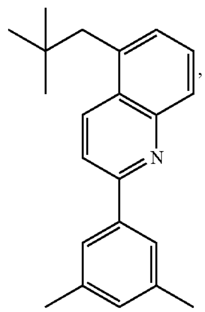
-continued
$L_{b34}$
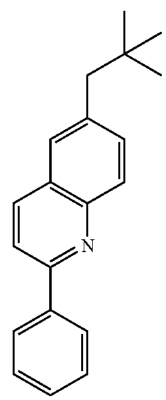
$L_{b35}$
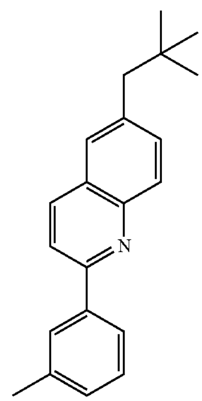
$L_{b36}$
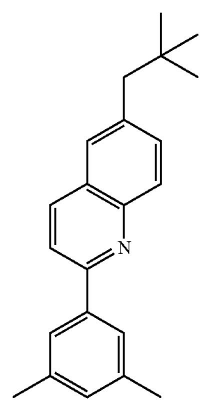
$L_{b37}$
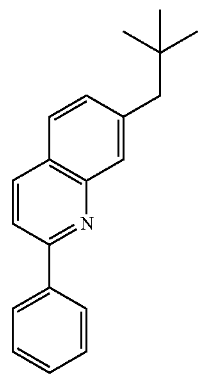

$L_{b38}$
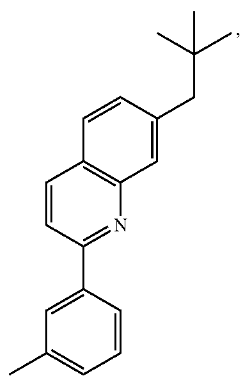
$L_{b39}$
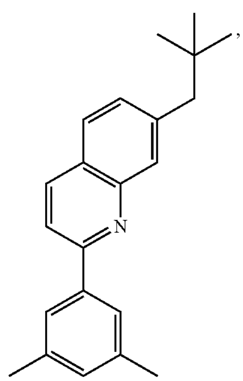
$L_{b40}$
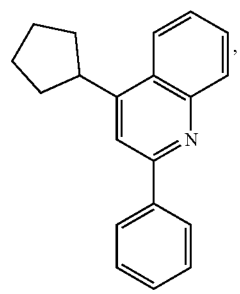
$L_{b41}$
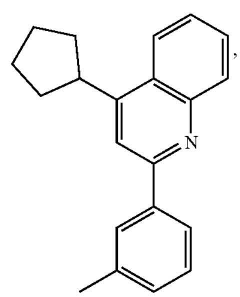
$L_{b42}$
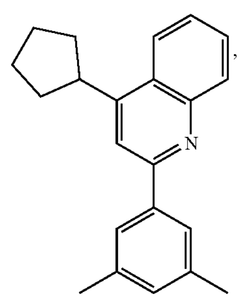
$L_{b43}$
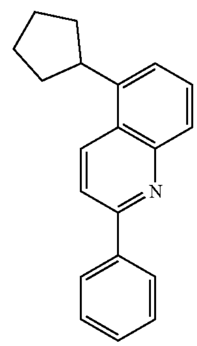
$L_{b44}$
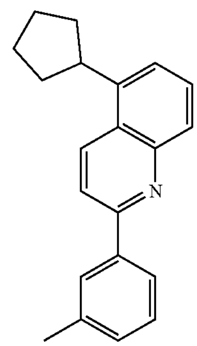
$L_{b45}$
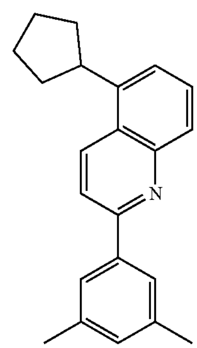
$L_{b46}$
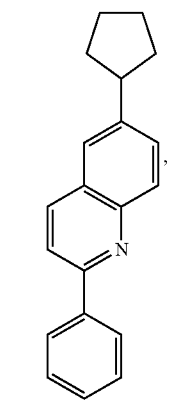

-continued
$L_{b47}$
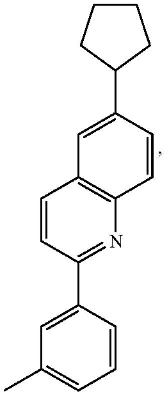
$L_{b48}$
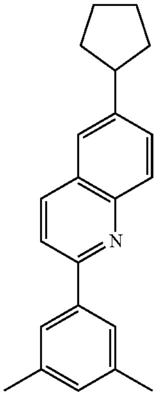
$L_{b49}$
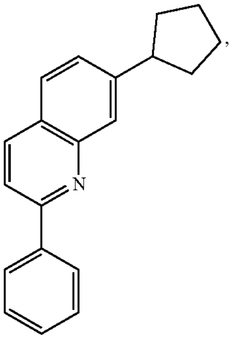
$L_{b50}$
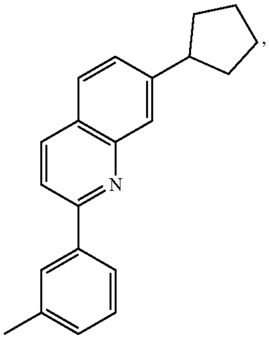
-continued
$L_{b51}$
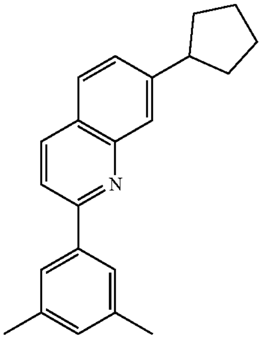
$L_{b52}$
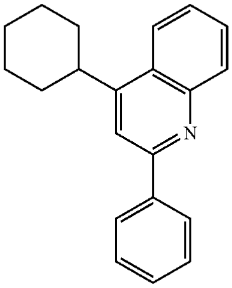
$L_{b53}$
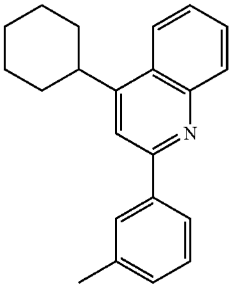
$L_{b54}$
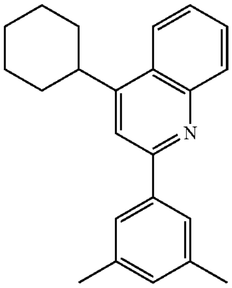
$L_{b55}$
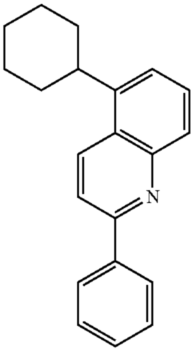

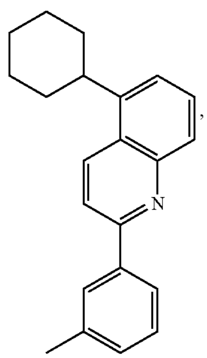
$L_{b56}$
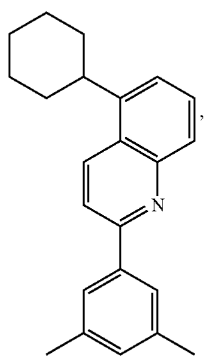
$L_{b57}$
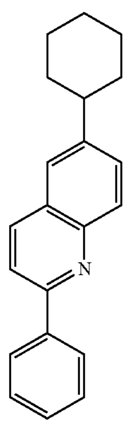
$L_{b58}$
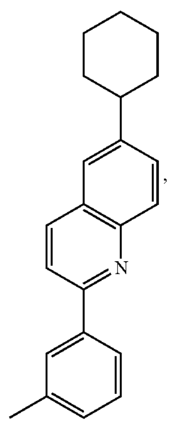
$L_{b59}$
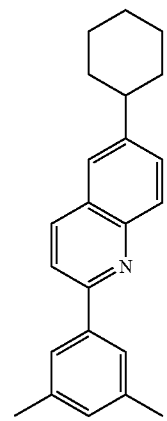
$L_{b60}$
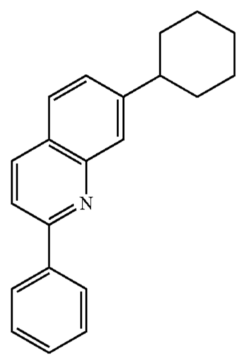
$L_{b61}$
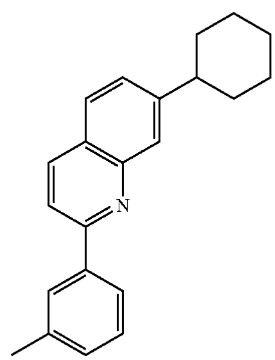
$L_{b62}$
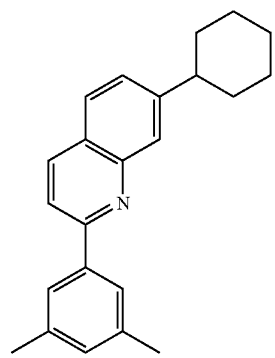
$L_{b63}$ -continued
$L_{b64}$
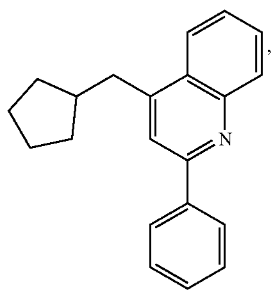
$L_{b65}$
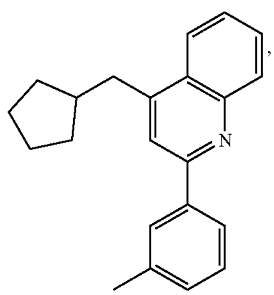
$L_{b66}$
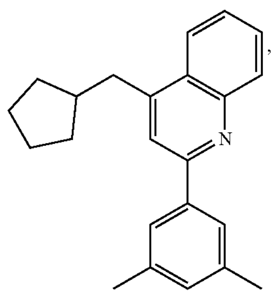
$L_{b67}$
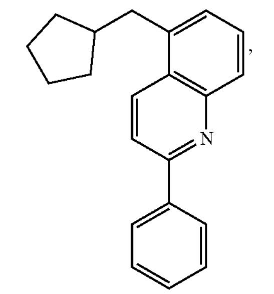
$L_{b68}$
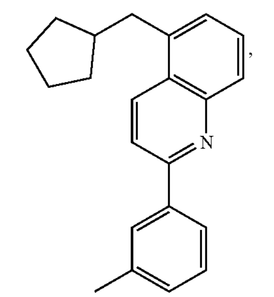
-continued
$L_{b69}$
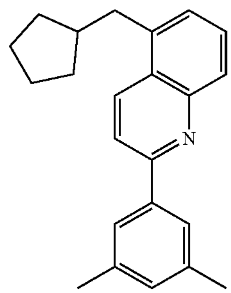
$L_{b70}$
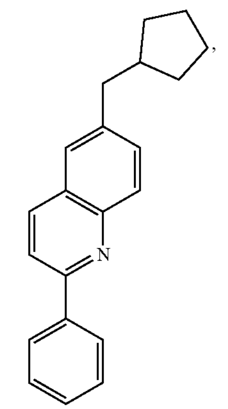
$L_{b71}$
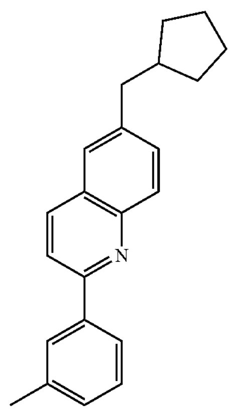
$L_{b72}$
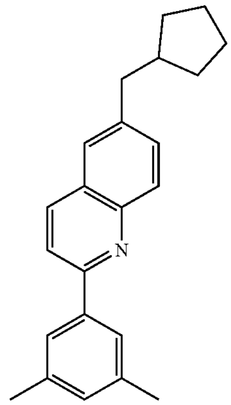

-continued
$L_{b73}$
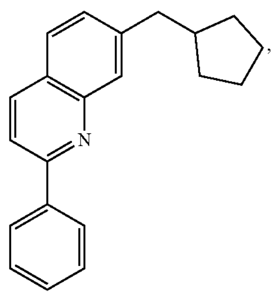
$L_{b74}$
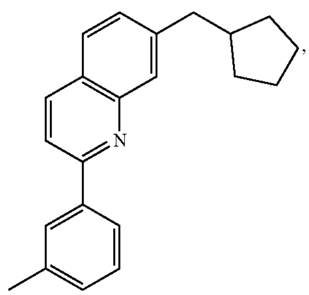
$L_{b75}$
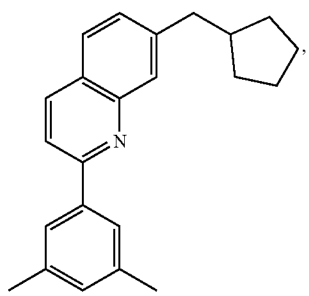
$L_{b100}$
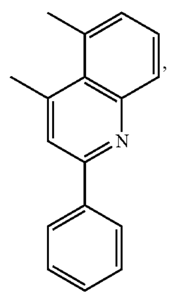
$L_{b101}$
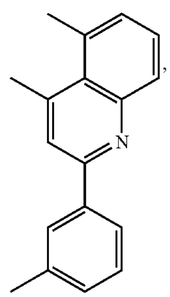
-continued
$L_{b102}$
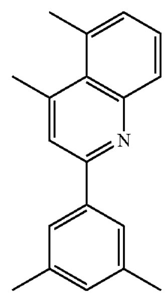
$L_{b103}$
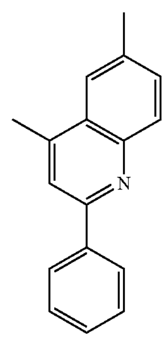
$L_{b104}$
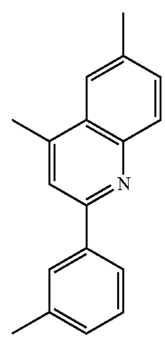
$L_{b105}$
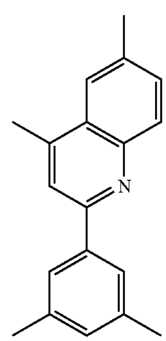
$L_{b106}$
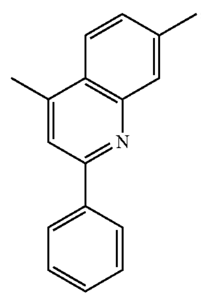

-continued
$L_{b107}$
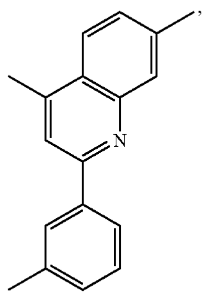
$L_{b108}$
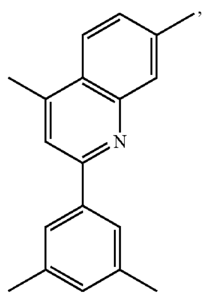
$L_{b109}$
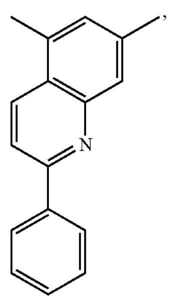
$L_{b110}$
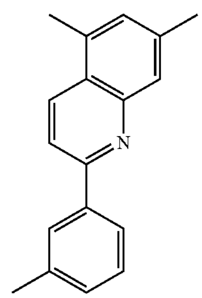
$L_{b111}$
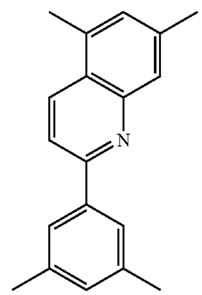
-continued
$L_{b133}$
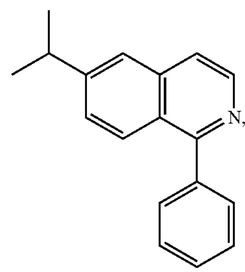
$L_{b134}$
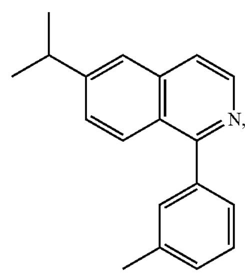
$L_{b135}$
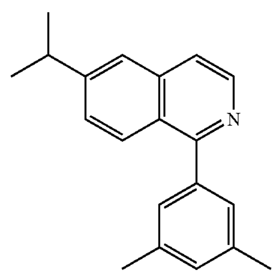
$L_{b136}$
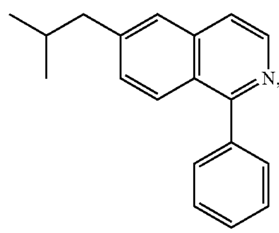
$L_{b137}$
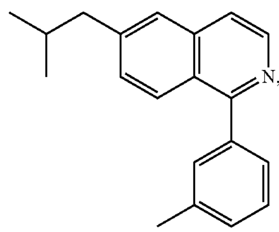
$L_{b138}$
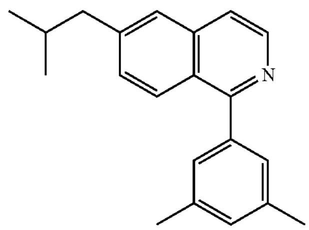

-continued
$L_{b139}$
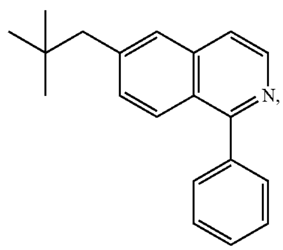
$L_{b140}$
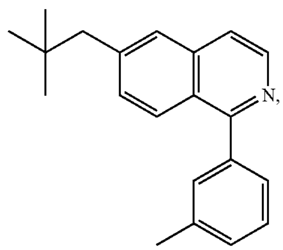
$L_{b141}$
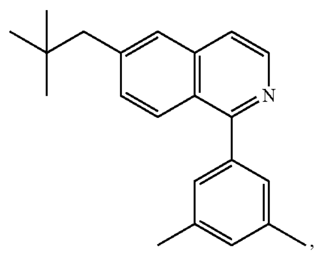
$L_{b142}$
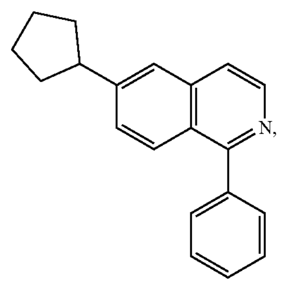
$L_{b143}$
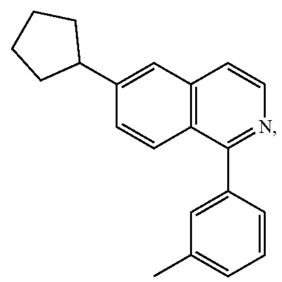
$L_{b144}$
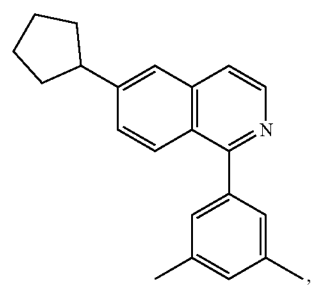
-continued
$L_{b145}$
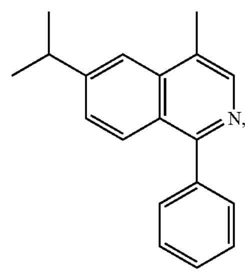
$L_{b146}$
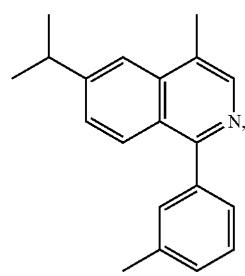
$L_{b147}$
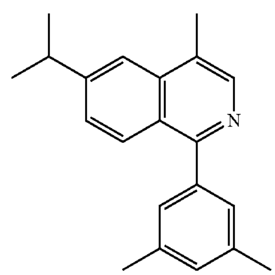
$L_{b148}$
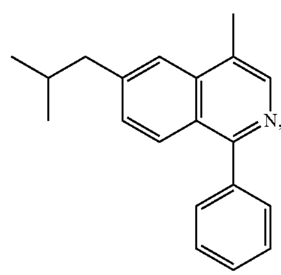
$L_{b149}$
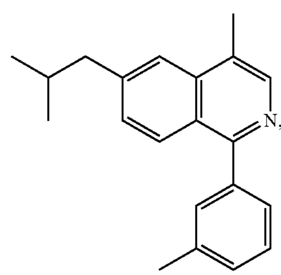

$L_{b150}$
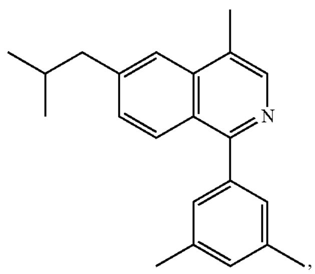
$L_{b151}$
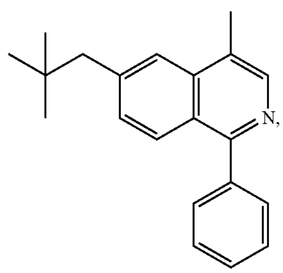
$L_{b152}$
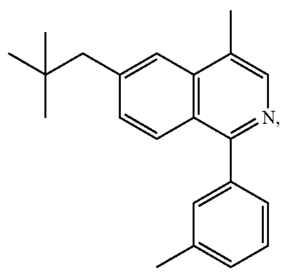
$L_{b153}$
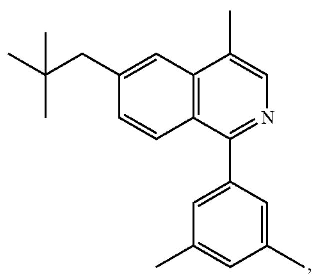
$L_{b154}$
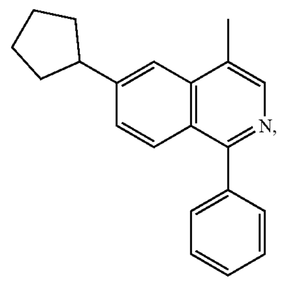
$L_{b155}$
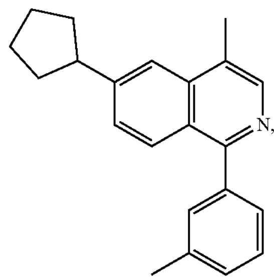
$L_{b156}$
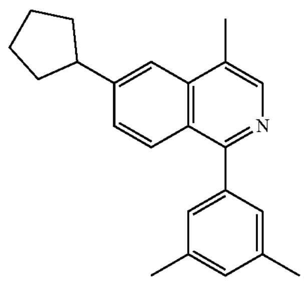
$L_{b163}$
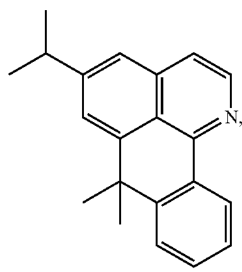
$L_{b164}$
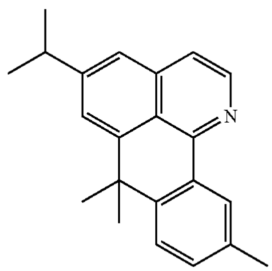
$L_{b165}$
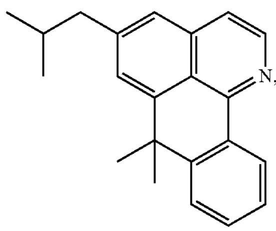
$L_{b166}$
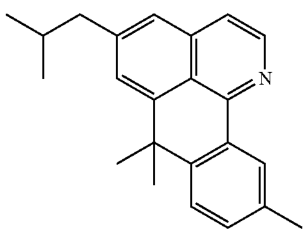

-continued $L_{b167}$

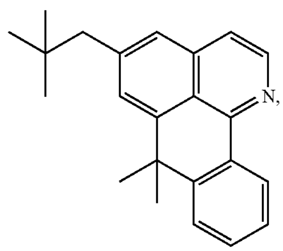

$L_{b168}$

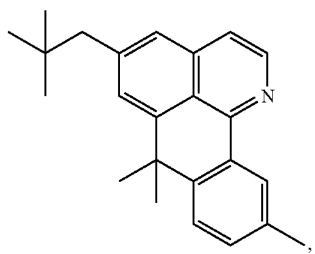

$L_{b169}$

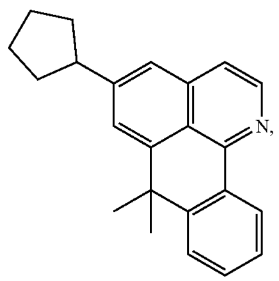

$L_{b170}$

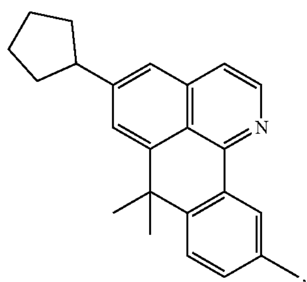

$L_{b201}$

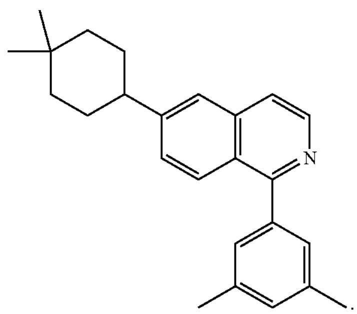

3. The metal complex of claim 1, wherein $L_a$ and $L_b$ can be partially or fully deuterated.

4. The metal complex of claim 1, wherein the ligand $L_b$ are independently selected from:

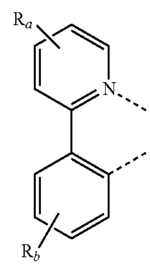

Wherein $R_a$ can represent di, tri, or tetra substitution;

$R_b$ can represent mono, di, tri, or tetra substitution or no substitution;

$R_a$ and $R_b$ are each independently selected from the group consisting of hydrogen, deuterium, a substituted or unsubstituted alkyl group having 1 to 20 carbon atoms, a substituted or unsubstituted cycloalkyl group having 3 to 20 ring carbon atoms, an unsubstituted heteroalkyl group having 1 to 20 carbon atoms, a substituted or unsubstituted arylalkyl group having 7 to 30 carbon atoms, an unsubstituted alkoxy group having 1 to 20 carbon atoms, an unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

at least two adjacent substituents $R_a$ are joined to form a ring, and the at least two adjacent $R_a$ are each independently selected from the group consisting of a substituted or unsubstituted cycloalkyl group having 3 to 20 ring carbon atoms, a substituted or unsubstituted arylalkyl group having 7 to 30 carbon atoms, an unsubstituted alkoxy group having 1 to 20 carbon atoms, an unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, an unsubstituted arylsilyl group having 6 to 20 carbon atoms, a sulfanyl group, and combinations thereof, two adjacent substituents $R_b$ are not optionally joined to form a ring.

5. A formulation comprises the metal complex of claim 1.

6. An electroluminescent device comprises an anode, a cathode, and an organic layer, disposed between the anode and the cathode, comprising a metal complex of claim 1.

7. The device of claim 6, wherein the organic layer is an emissive layer and the metal complex is an emitter.

8. The device of claim 6, wherein the device emits red light.

9. The device of claim 6, wherein the device emits white light.

10. The device of claim 6, wherein the organic layer further comprises a host compound.

11. The device of claim 10, wherein the host compound comprises a donor part and an acceptor part.

12. The device of claim 10, wherein the host compound comprises at least one chemical group selected from the groups consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and combinations thereof.

* * * * *